(12) United States Patent
Boemmels

(10) Patent No.: US 11,257,823 B2
(45) Date of Patent: Feb. 22, 2022

(54) SEMICONDUCTOR DEVICE HAVING VERTICAL TRANSISTORS AND METHOD OF FORMING SAME

(71) Applicant: IMEC vzw, Leuven (BE)

(72) Inventor: Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 111 days.

(21) Appl. No.: 16/049,528

(22) Filed: Jul. 30, 2018

(65) Prior Publication Data

US 2019/0035795 A1   Jan. 31, 2019

(30) Foreign Application Priority Data

Jul. 28, 2017   (EP) ..................................... 17183680

(51) Int. Cl.
*H01L 27/11*         (2006.01)
*H01L 21/8238*       (2006.01)
(Continued)

(52) U.S. Cl.
CPC .... *H01L 27/1104* (2013.01); *H01L 21/26513* (2013.01); *H01L 21/823807* (2013.01);
(Continued)

(58) Field of Classification Search
CPC ........... H01L 29/7802; H01L 29/78642; H01L 29/0847; H01L 29/41741; H01L 29/7827;
(Continued)

(56) References Cited

U.S. PATENT DOCUMENTS 7,972,920 B2 * 7/2011 Chakihara ....... H01L 21/823885
                                                 438/212
8,373,235 B2   2/2013 Masuoka et al.
(Continued)

FOREIGN PATENT DOCUMENTS

EP   2 239 771 A1   10/2010
EP   2 254 149 A2   11/2010
EP   2 254 149 A3   1/2011

OTHER PUBLICATIONS

European Search Report for Application No. EP 21084883 dated Feb. 5, 2018; 8 pages.

*Primary Examiner* — Khiem D Nguyen
(74) *Attorney, Agent, or Firm* — Knobbe, Martens, Olson & Bear, LLP

(57) ABSTRACT

The disclosed technology generally relates to semiconductor devices, and more particularly to a static random access memory (SRAM) having vertical channel transistors and methods of forming the same. In an aspect, a semiconductor device includes a semiconductor substrate and a semiconductor bottom electrode region formed on the substrate and including a first region, a second region and a third region arranged side-by-side. The second region is arranged between the first and the third regions. A first vertical channel transistor, a second vertical channel transistor and a third vertical channel transistor are arranged on the first region, the second region and the third region, respectively. The first, second and third regions are doped such that a first p-n junction is formed between the first and the second regions and a second p-n junction is formed between the second and third regions. A connection region is formed in the bottom electrode region underneath the first, second and third regions, wherein the connection region and the first and third regions are doped with a dopant of a same type. A resistance of a path extending between the first and the third (Continued)

regions through the connection region is lower than a resistance of a path extending between the first and the third regions through the second region. A second aspect is a method of forming the semiconductor device of the first aspect.

11 Claims, 16 Drawing Sheets

(51) Int. Cl.
| | |
|---|---|
| *H01L 29/78* | (2006.01) |
| *H01L 29/66* | (2006.01) |
| *H01L 29/786* | (2006.01) |
| *H01L 21/265* | (2006.01) |
| *H01L 29/06* | (2006.01) |
| *H01L 29/08* | (2006.01) |
| *H01L 29/10* | (2006.01) |
| *H01L 29/36* | (2006.01) |
| *H01L 29/417* | (2006.01) |
| *H01L 21/8234* | (2006.01) |
| *H01L 21/02* | (2006.01) |
| *H01L 21/027* | (2006.01) |
| *H01L 21/28* | (2006.01) |
| *H01L 21/306* | (2006.01) |
| *H01L 21/321* | (2006.01) |
| *H01L 21/3213* | (2006.01) |
| *H01L 29/49* | (2006.01) |

(52) U.S. Cl.
CPC ............... *H01L 21/823828* (2013.01); *H01L 21/823871* (2013.01); *H01L 21/823885* (2013.01); *H01L 29/0676* (2013.01); *H01L 29/0847* (2013.01); *H01L 29/1037* (2013.01); *H01L 29/1079* (2013.01); *H01L 29/36* (2013.01); *H01L 29/41741* (2013.01); *H01L 29/66719* (2013.01); *H01L 29/66727* (2013.01); *H01L 29/7802* (2013.01); *H01L 29/7827* (2013.01); *H01L 29/78642* (2013.01); *H01L 29/78696* (2013.01); *H01L 21/0228* (2013.01); *H01L 21/0276* (2013.01); *H01L 21/28088* (2013.01); *H01L 21/30604* (2013.01); *H01L 21/3212* (2013.01); *H01L 21/32133* (2013.01); *H01L 21/32139* (2013.01); *H01L 21/823475* (2013.01); *H01L 21/823487* (2013.01); *H01L 21/823857* (2013.01); *H01L 29/4966* (2013.01); *H01L 29/66545* (2013.01)

(58) Field of Classification Search
CPC ............ H01L 29/0676; H01L 29/1037; H01L 29/1079; H01L 29/66727; H01L 29/78696; H01L 21/823487; H01L 21/26513; H01L 21/823871; H01L 21/823885; H01L 27/11; H01L 27/1104; H01L 29/66719; H01L 21/823807; H01L 21/823828; H01L 29/36; H01L 21/82307; H01L 21/82328
See application file for complete search history.

(56) References Cited

U.S. PATENT DOCUMENTS

| | | | |
|---|---|---|---|
| 9,087,922 B2* | 7/2015 | Sun | ................ H01L 21/823885 |
| 9,251,888 B1 | 2/2016 | Liaw | |
| 9,515,077 B1 | 12/2016 | Liaw | |
| 9,653,585 B2* | 5/2017 | Zhang | ............... H01L 29/78642 |
| 10,083,971 B1* | 9/2018 | Zang | ................... H01L 27/1104 |
| 2003/0136978 A1* | 7/2003 | Takaura | .................. H01L 27/11 |
| | | | 257/210 |
| 2004/0113207 A1 | 6/2004 | Hsu et al. | |
| 2011/0063894 A1* | 3/2011 | Lee | ....................... G11C 11/412 |
| | | | 365/154 |
| 2013/0272056 A1* | 10/2013 | Liaw | ................... H01L 27/0207 |
| | | | 365/154 |
| 2015/0179655 A1* | 6/2015 | Nakanishi | ............. H01L 27/281 |
| | | | 257/9 |
| 2016/0078922 A1 | 3/2016 | Liaw | |
| 2016/0284712 A1* | 9/2016 | Liaw | ..................... H01L 29/665 |
| 2017/0169873 A1* | 6/2017 | Appeltans | ........... G11C 11/1657 |
| 2017/0194487 A1* | 7/2017 | Chen | ................... H01L 29/0869 |
| 2018/0068901 A1* | 3/2018 | Cheng | ................. H01L 21/3086 |
| 2018/0269310 A1* | 9/2018 | Mochizuki | ...... H01L 21/823814 |
| 2018/0366469 A1* | 12/2018 | Hsu | ........................ G11C 11/419 |
| 2018/0374857 A1* | 12/2018 | Zang | ................. H01L 21/76802 |

* cited by examiner

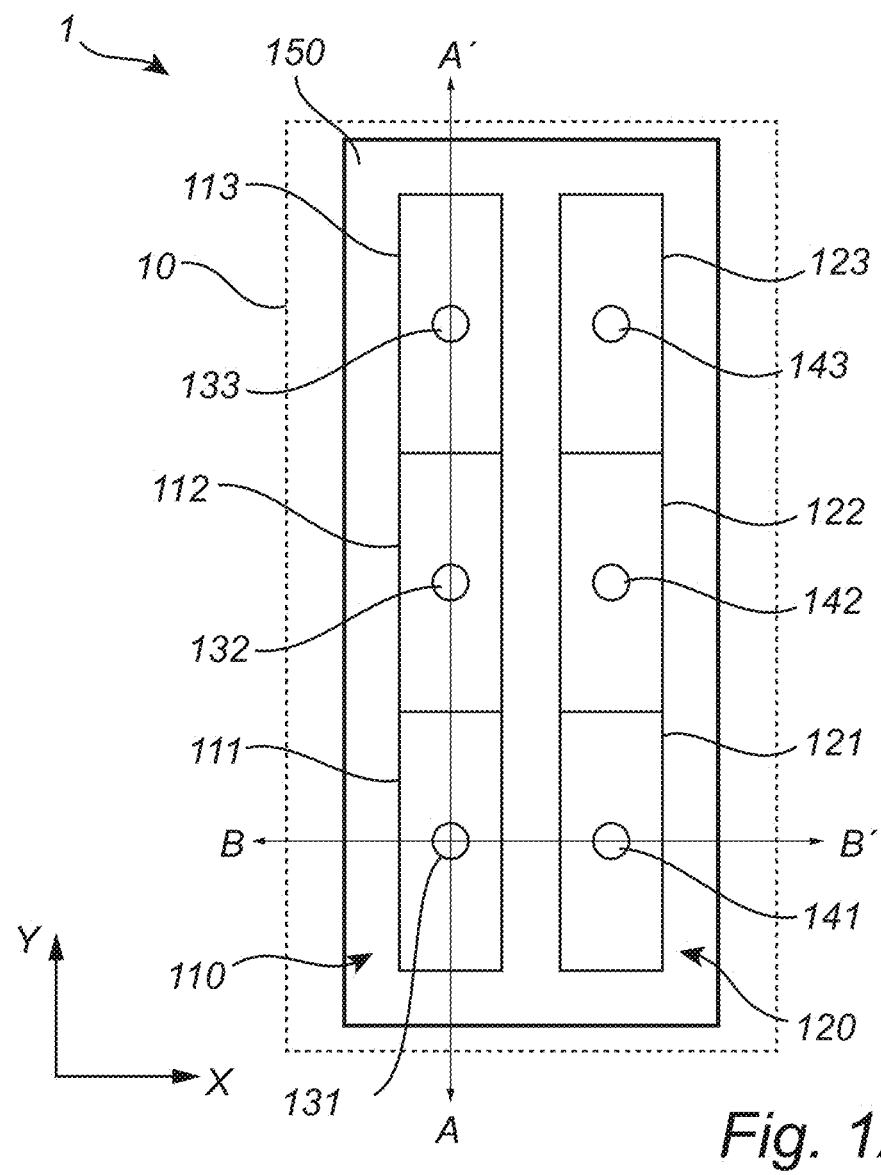
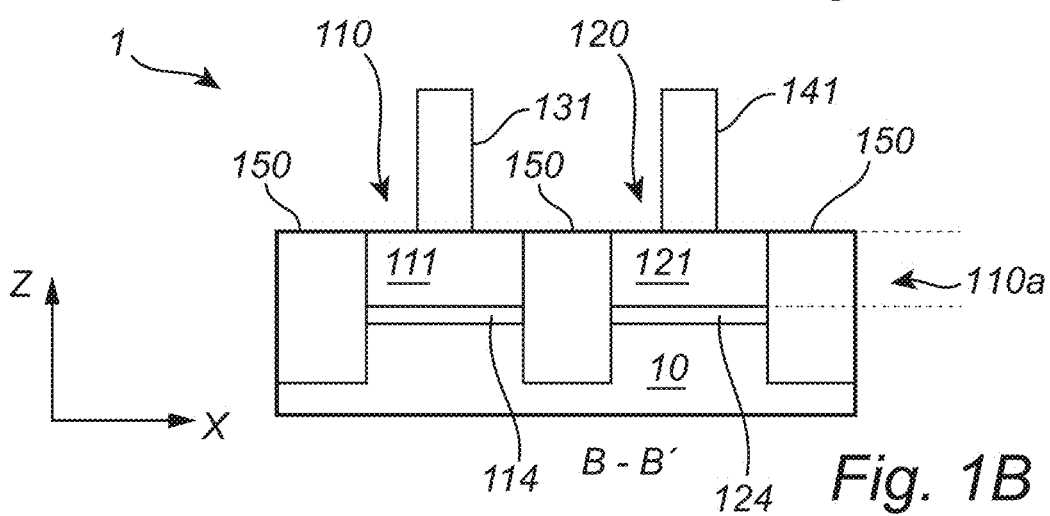

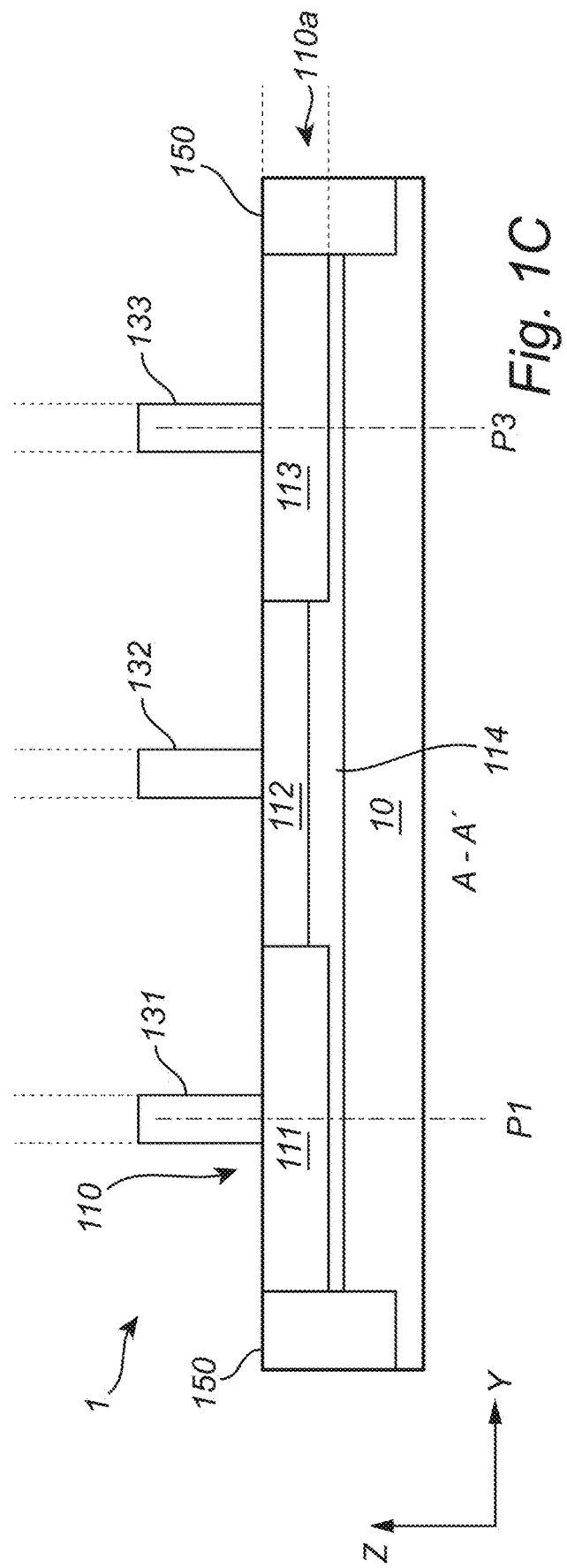

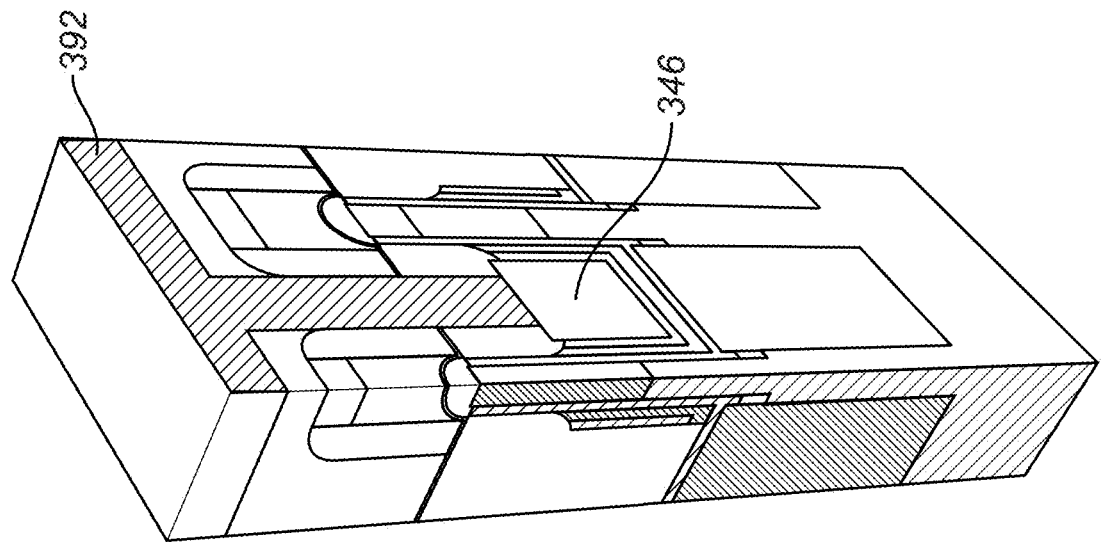
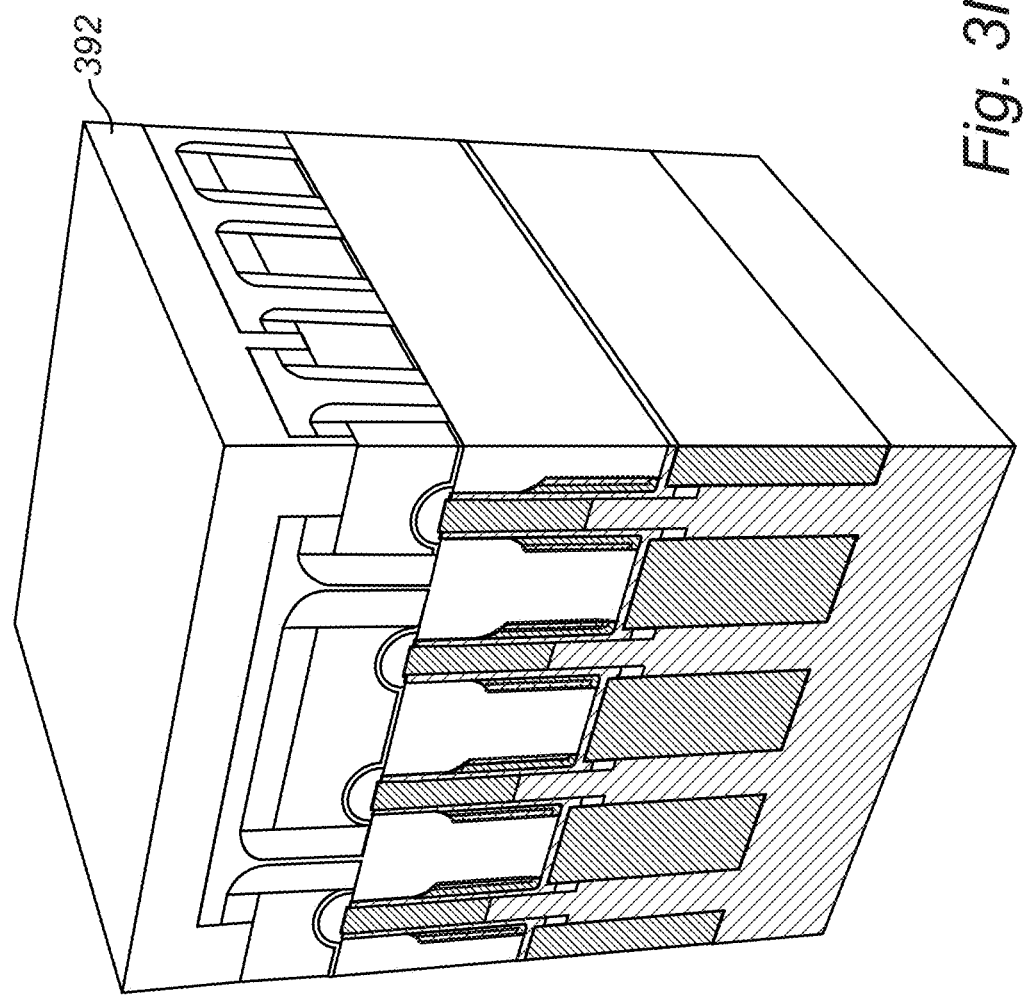
Fig. 3N

SEMICONDUCTOR DEVICE HAVING VERTICAL TRANSISTORS AND METHOD OF FORMING SAME

CROSS-REFERENCE TO RELATED APPLICATIONS

This application claims foreign priority to European Patent Application No. EP 17183680.2, filed Jul. 28, 2017, the content of which is incorporated by reference herein in its entirety.

BACKGROUND

Field

The disclosed technology generally relates to semiconductor devices, and more particularly to a static random access memory (SRAM) having vertical channel transistors and methods of forming the same.

Description of the Related Technology

In the constant strive to provide even more area efficient circuit designs, new semiconductor devices are being developed. One promising type of devices are vertical channel transistor devices, such as vertical nanowire field effect transistors (FETs). Owing to the vertically oriented channels, a physical gate length of a vertical nanowire FET is not defined by a lateral linewidth of a gate as in a planar FET, but instead by the thickness of the gate conductor layer overlapping a vertical channel of the vertical nanowire FET. Secondly, the source and drain regions of a vertical transistor device are vertically separated in relation to each other, in contrast to being laterally separated by a planar channel in a planar FET. For these reasons, among others, vertical transistor devices enable dense device integrations.

In various circuits, it is needed to interconnect the source/drains of transistors. Notably, in a static random access memory (SRAM) bit cell, the bottom source/drains (i.e. being located below the gates) of the pull-up transistor, the pull-down transistor and the pass transistor of each half-cell are electrically connected. In some technologies, this interconnection is made by creating individual vertical metal contacts to the bottom source/drain of each transistor and connecting the vertical metal contacts in a metal layer arranged above the transistors in the back-end-of-line (BEOL). A drawback with this approach, however, is that the bit cell needs to be dimensioned to accommodate the vertical contacts. This may, however reduce the overall area efficiency of the bit cell. Thus, there is a need for process architectures with improved scalability, including process architectures for interconnecting sources and drains of transistors of SRAM bit cells.

SUMMARY OF CERTAIN INVENTIVE ASPECTS

An objective of certain inventive aspects is to address the afore-mentioned challenge. Additional and/or alternatives objectives may be understood from the following.

According to a first aspect, a semiconductor device comprises: a semiconductor substrate, a semiconductor bottom electrode region formed on the substrate and including a first region, a second region and a third region arranged side-by-side, the second region being arranged between the first and the third regions, and a first, a second and a third vertical channel transistor arranged on the first, the second and the third region, respectively, wherein the first, the second and the third regions are doped such that a first p-n junction is formed between the first and the second region and a second p-n junction is formed between the second and third region, and wherein a connection region is formed in the bottom electrode region underneath the first, second and third regions, wherein the connection region is doped with a same type of dopant as the first and third regions and wherein a resistance of a path extending between the first and the third regions via the connection region is lower than a resistance of a path extending between the first and the third regions via the second region.

The semiconductor device according to embodiments enables area efficient implementations of circuit designs including three-transistor sets with electrically interconnected bottom source/drain regions, for instance SRAM circuits.

According to the first aspect, first through third transistors may be arranged on a common semiconductor bottom electrode region. The first and the third regions may be electrically interconnected through the connection region along an electrical path bypassing the first and the second p-n junctions. The respective bottom source/drain regions of the first through third transistors may hence be directly interconnected without any dedicated metal contacts.

The connection region of the semiconductor device also provides advantages compared to shorting a p-n junction using a silicide. Silicide layers are typically comparably temperature critical and presence of such silicide layers in the bottom electrode region (which may need to be formed early in a device fabrication flow) could potentially reduce the thermal budget for fabrication steps following silicidation. Silicides may also have a tendency to create defects when used in connection with narrow structures. Additionally, silicidation could also cause unintended neighboring semiconductor structures to be silicided, such as vertical semiconductor structures of the vertical channel transistors.

By vertical channel transistor is hereby meant a transistor having a channel oriented vertically or transverse with respect to (a main plane of extension or main surface) of the semiconductor substrate. An orientation of the channel may here refer to the direction of the flow of charge carriers through the channel.

Each of the first, second and third transistors may include a vertically extending semiconductor structure (for instance formed as a vertical nanowire or a vertical column). The channel of each transistor may be formed in the semiconductor structure.

Each of the first, second and third transistors may include a gate extending along the channel (which may be formed in the vertical semiconductor structure).

Each of the first, second and third transistors may include a top source/drain formed in a top portion of the vertical extending semiconductor structure of the respective transistor.

Each of the first, second and third transistors may include a bottom source/drain formed in a bottom portion of the vertically extending semiconductor structure of the respective transistor. The bottom portion may be formed on or in abutment with the first, second and third regions, respectively, of the bottom electrode region.

Additionally or alternatively, the bottom source/drain of each of the first, second and third transistors may extend into or be formed in the first, second and third regions, respectively, of the bottom electrode region.

As used herein, the term "horizontal" direction or "horizontal" plane denotes a direction or plane being parallel to (a main plane of extension or main surface of) the semiconductor substrate.

As used herein, the term "vertical" direction or "vertical" plane denotes a direction or plane being perpendicular to (a main plane of extension or main surface of) the semiconductor substrate.

Accordingly, the terms "above", "upper", "top" and "below", "lower", "bottom" refer to relative positions along the vertical direction.

By "semiconductor bottom electrode region" is hereby meant a continuous region, structure or portion of a semiconductor material of or formed on the semiconductor substrate.

The first, second and third regions of the bottom electrode regions form sub-regions of the bottom electrode region. The first, second and third regions may form diffusion regions (of either p- or n-type) for the first, second and third transistors, respectively.

The first and second region may form abutting regions and be doped with dopants of opposite types, thereby forming a first p-n junction. The second and third region may form abutting regions and be doped with dopants of opposite types, thereby forming a second p-n junction.

A doping concentration or doping level of the first and third regions may be equal to or greater than a doping concentration of the connection region.

The first region, the second region and the third region may form an n-doped region, a p-doped region and an n-doped region, respectively, wherein the connection region may form an n-doped region. Alternatively, the first region, the second region and the third region may form a p-doped region, an n-doped region and a p-doped region, respectively, wherein the connection region may form a p-doped region.

According to one embodiment, the semiconductor substrate is provided with a doped well region, wherein the connection region is formed on the doped well region, the well region being doped with a dopant type which is opposite to a dopant type of the connection region. A p-n junction may hence be formed below the connection region to prevent charge leakage from the bottom electrode region to the substrate. If the connection region forms an n-type region, the doped well region may form a p-well. If the connection region forms a p-type region, the doped well region may form an n-well. A doping concentration of the second region may be greater than a doping concentration of the doped well region.

According to one embodiment the connection region extends from a position underneath a channel of the first transistor to a position underneath a channel of the third transistor. This enables a low-resistance connection between the first and third regions. Due to the connection region extending between positions underneath, i.e. directly below, the channels of the first and the second transistor, a relatively large interface may be formed between the first region and the connection region and between the third region and the connection region.

According to one embodiment the connection region is laterally coextensive with the first, the second and third regions. This enables a low-resistance connection between the first and third regions.

According to one embodiment the semiconductor device further comprises an insulating layer laterally embedding the bottom electrode region and extending to a level below the connection region. The bottom electrode region, in particular the connection region, may thereby be electrically insulated from adjacent bottom electrode regions.

According to a second aspect, a static random access memory (SRAM) comprises a plurality of bit cells, each bit cell including a first and a second half-cell each including a semiconductor device according to the first aspect or any of the embodiments thereof, wherein the first, the second and the third transistor of the first half-cell form a first set of transistors including a pass transistor, a pull-up transistor and a pull-down transistor of the first half-cell, and wherein the first, the second and the third transistor of the second half-cell form a second set of transistors including a pass transistor, a pull-up transistor and a pull-down transistor of the second half-cell.

The merits of the semiconductor device according to the first aspect may hence be applied to an SRAM, thereby enabling area efficient a memory circuit.

According to one embodiment the SRAM further comprises a conductive pattern including a first and a second pattern part arranged in each one of the plurality of bit cells, wherein the first pattern part includes a first gate portion arranged in the first half-cell to form a common gate for the pull-up and pull-down transistor of the first set of transistors, a first bottom electrode contact portion arranged in contact with the first p-n junction of the second half-cell, and a first cross-coupling portion extending between the first bottom electrode contact portion and the first gate portion, and wherein the second pattern part includes a second gate portion arranged in the second half-cell to form a common gate for the pull-up and pull-down transistor of the second set of transistors, a second bottom electrode contact portion arranged in contact with the second p-n junction of the first half-cell, and a second cross-coupling portion extending between the second bottom electrode contact portion and the second gate portion.

The first and second pattern parts enable a direct cross-coupling connection between gate level and the bottom electrode regions of the half-cells. The bit cell-internal cross-coupling between the two half-cells need hence not be implemented in routing layers in the back-end-of-line.

Hence, the conductive pattern provides a double function of providing gates for the pull-up and pull-down transistors and acting as a "routing layer" allowing a compact and area efficient connection between the gates and the bottom electrodes of the half-cells.

By the first/second bottom electrode contact portion contacting, i.e. abutting, the second p-n junction of the second/first half-cell, an electrical connection between the common gate of the pull-up and pull-down transistors of each half-cell and a pair of abutting regions of the opposite half-cell may be provided.

The conductive pattern hence further contributes to the area efficiency allowed by the bottom electrode region.

The first gate portion may advantageously be arranged to wrap around the channels of the pull-up and pull-down transistors of the first set of transistors. The second gate portion may advantageously be arranged to wrap around the channels of the pull-up and pull-down transistors of the second set of transistors. Vertical channel transistors with wrap-around gates (also known as i.e. gate-all-around transistors) provide advantageous channel control.

By a gate portion wrapping around a channel, is hereby meant that the gate portion completely encloses the channel in a circumferential direction, i.e. along a vertical section of the vertical semiconductor structure of the transistor. The vertical section enclosed by the gate portion forms the channel of the transistor.

The conductive pattern may include a single conductive material or a combination of different materials such that the combination forms a conductive material. The conductive pattern may include a single metal or a combination of different metals. A "metal" may in this case refer to a single element metal or a mixture or an alloy of one or different single element metals.

The first and second pattern parts preferably form discrete pattern parts. By "discrete pattern parts" is hereby meant that the pattern parts are physically separated or spaced apart to form physically disconnected parts of the conductive pattern.

Each of the first and the second pattern part, forms a continuous conductive pattern part or structure, extending interrupted between the first/second bottom electrode portion to the second/first vertical semiconductor structure. Accordingly, the first/second bottom electrode contact portion, the first/second cross-coupling portion and the first/second gate portion of the first/second pattern part refers to different portions of a continuous or single-piece conductive pattern part.

The conductive pattern may further include a third (discrete) pattern part including a (third) gate portion arranged in the first half-cell to form a gate for the first pass transistor. The first and third gate portions may be configured to be independently controllable with respect to each other.

The conductive pattern may further include a fourth (discrete) pattern part including a (fourth) gate portion arranged in the second half-cell to form a gate for the second pass transistor. The second and fourth gate portions may be configured to be independently controllable with respect to each other.

According to one embodiment the SRAM further comprises an insulating layer laterally embedding the bottom electrode regions of the bit cell and extending to a level below the connection regions of the bit cell, wherein the connection regions of the bottom electrode regions of the half-cells are electrically insulated from each other.

According to one embodiment the SRAM further comprises: a set of top electrodes arranged on top source/drains of the transistors of the bit cells, wherein an insulating sidewall barrier layer is formed on sidewalls of the top electrodes, and a set of gate contacts, each gate contact including an upper contact portion arranged at a level above the top electrodes and a lower contact portion extending downwardly from the upper contact portion to a gate of a pass transistor of one (of the half-cells) of the bit cells, wherein the insulating sidewall barrier layers insulates the top electrodes from the lower contact portions of the gate contacts.

According to the present embodiment the gates may be contacted by vertically extending gate contact portions extending in, possibly tight, spaces between adjacent top electrodes. This is enabled by the presence of the insulating sidewall barrier layer on the top electrodes (i.e. which forms an insulating sidewall spacer on the top electrodes) which ensures at least a minimum amount of electrical insulation between the lower contact portion and adjacent top electrodes.

The top electrodes may be covered by a (top electrode level) insulating layer. The insulating sidewall barrier layer may be formed of a different material than the insulating layer covering the top electrodes. This enables etch selectivity during forming holes for the lower contact portions in the insulating layer. I.e. the (top electrode level) insulating layer covering the top electrodes may be etched selectively with respect to insulating sidewall barrier layer. The insulating sidewall barrier layer may hence act as a sidewall etch barrier layer during the formation of the holes for the gate contacts. This in turn enables formation of gate contacts which in a sense are self-aligned with respect to the top electrodes.

According to a third aspect there is provide a method for forming a semiconductor device comprising: providing a semiconductor substrate with a semiconductor bottom electrode region including a first doped region, a second doped region, a third doped region and a doped connection region, wherein the second region is formed between the first and third regions and wherein the first, the second and the third regions are doped such that a first p-n junction is formed between the first and the second region and a second p-n junction is formed between the second and third region, and wherein the connection region extends underneath the first, second and third regions and is doped with a same type of dopant as the first and third regions and wherein a resistance of a path extending between the first and the third regions via the connection region is lower than a resistance of a path extending between the first and the third regions via the second region, and forming a first, a second and a third vertical channel transistor on the first, the second and the third region, respectively, of the bottom electrode region.

The method according to the third aspect enables forming of a semiconductor device including a bottom electrode region and providing the same or corresponding advantages as those discussed in connection with the first aspect above.

According to one embodiment, forming the semiconductor bottom electrode region includes: providing the substrate with a doped region doped by a first type of dopant, implanting, in a first and a third region of an upper thickness portion of the doped region, the first type of dopant, and implanting, in a second region of the upper thickness portion of the doped region, between the first and the third region of the upper thickness portion, a second type of dopant, wherein the first region of the upper thickness portion forms the first region of the bottom electrode region, the second region of the upper thickness portion forms the second region of the bottom electrode region and the third region of the upper thickness portion forms the third region of the bottom electrode region, and wherein a lower thickness portion of the doped region forms the connection region.

Thereby, a bottom electrode region including first, second and third doped regions in an upper thickness portion of the bottom electrode region, and a doped connection region extending underneath the upper thickness portion in a lower thickness portion of the bottom electrode region may be formed. The region of the semiconductor substrate may be a region doped with the second type of dopant.

The doped region may be formed by implanting the first type of dopant in the substrate.

The doped region may be formed by epitaxially growing on the substrate a semiconductor material doped with the first type of dopant.

As used herein, reference to a "first type of dopant" and "a second type of dopant" may refer to an acceptor type (p-type) dopant and a donor type (n-type) dopant, respectively, or a donor type dopant and an acceptor type dopant, respectively. The first and second types hence refer to opposite types of dopants. Unless otherwise is explicitly stated, references to "the first type of dopant" and "the second type of dopant" should not be understood as references to a particular species of the dopant but only to the type of dopant. Two or more regions being doped with "the first type dopant" should accordingly be understood to be doped with a same type of dopant, for instance acceptors.

However, the actual species of the dopants (e.g. the acceptors) need not be the same in the two or more regions. This applies correspondingly to two or more regions being doped with "the second type of dopant".

According to one embodiment, the bottom electrode region forms a first bottom electrode region and the method further comprises: providing the semiconductor substrate with a second bottom electrode region including a first doped region, a second doped region, a third doped region and a doped connection region, wherein the second region is formed between the first and third regions and wherein the connection region extends underneath the first, second and third regions, wherein the first, the second, the third, and the connection region of the second bottom electrode region are doped with a same type of dopant as the first, the second, the third, and the connection region of the first bottom electrode region, respectively, and wherein a resistance of a path extending between the first and the third regions of the second bottom electrode region via the connection region of the second bottom electrode region is lower than a resistance of a path extending between the first and the third regions of the second bottom electrode region via the second region of the second bottom electrode region, forming an insulating layer extending between the first and the second bottom electrode regions, the insulating layer extending to a level below the connection regions, and forming a first, a second and a third vertical channel transistor on the first, the second and the third region, respectively, of the second bottom electrode region.

This allows forming of two bottom electrode regions adjacent to each other while being electrically insulated from each other by an insulating layer. This embodiment may be used to form a bit cell of an SRAM, the bit cell including a first half-cell including the first bottom electrode region and the first through third transistors formed thereon, and a second half-cell including the second bottom electrode region and the first through third transistors formed thereon.

The first, second and third transistors formed on the second bottom electrode region may alternatively be termed a fourth, a fifth and a sixth transistor (of the bit cell).

The insulating layer may be formed to laterally embed each one of the bottom electrode regions and extending to a level below the connection regions.

According to one embodiment, forming the vertical channel transistors on the first and second bottom electrode regions comprise: forming a first, a second, and a third vertical semiconductor structure on the first, the second and the third region, respectively, of each of the first and the second bottom electrode regions, covering the first and second bottom electrode regions with a bottom electrode insulating layer such that the vertical semiconductor structures protrude from the insulating layer, forming a first hole exposing the second p-n junction of the first bottom electrode region and a second hole exposing the first p-n junction of the second bottom electrode region, the first and the second hole extending vertically through the bottom electrode insulating layer, and forming a conductive pattern including a set of discrete pattern parts on the bottom electrode insulating layer, wherein forming the conductive pattern includes: forming a first pattern part including a first gate portion to form a common gate for the first and the second vertical semiconductor structure formed on the first bottom electrode region, a first bottom electrode contact portion arranged in the second hole, and a first cross-coupling portion extending between the first bottom electrode contact portion and the first gate portion, and forming a second pattern part including a second gate portion to form a common gate for the second and the third vertical semiconductor structure formed on the second bottom electrode region, a second bottom electrode contact portion arranged in the first hole, and a second cross-coupling portion extending between the second bottom electrode contact portion and the second gate portion.

This embodiment enables forming of a direct cross-coupling connection between gate level and the bottom electrode regions, as explained above in connection with the corresponding embodiment of the first aspect.

According to the method, the connection between the bottom electrode and the gate level is enabled by forming the first and second holes prior to forming the conductive pattern. This results in an efficient process with respect to the number of process steps.

Forming the conductive pattern may further comprise forming a third pattern part including a third gate portion to form a gate for the third vertical semiconductor structure formed on the first bottom electrode region. The third pattern part may be arranged above the first bottom electrode-region. The first and third gate portions may be configured to be independently controllable with respect to each other.

Forming the conductive pattern may further comprise forming a fourth pattern part including a fourth gate portion to form a gate for the first vertical semiconductor structure formed on the second bottom electrode region. The fourth pattern part may be arranged above the second bottom electrode-region. The second and fourth gate portions may be configured to be independently controllable with respect to each other.

According to one embodiment, the method further comprises forming a gate level conductor including at least one conductive layer, the gate level conductor filling the first and the second hole and embedding the protruding portions of the vertical semiconductor structures, wherein forming the conductive pattern further includes forming an etch mask above the gate level conductor, the etch mask including a first discrete mask portion for defining the first pattern part and a second discrete mask portion for defining the second pattern part, and etching the gate level conductor in a region exposed by the etch mask.

The gate level conductor may accordingly be patterned such that gate-, bottom electrode contact-, and cross-coupling portions are formed.

The first/second gate portion may be formed by a portion of the gate level conductor remaining (subsequent to the etching) about the first/second vertical semiconductor structure. The first/second bottom electrode contact portion may be formed by a portion of the gate level conductor remaining in the second/first hole and protruding therefrom. The first/second cross-coupling portion may be formed by a remaining portion of the gate level conductor extending between the first/second gate portion and bottom electrode contact portion.

In case the gate level conductor is a compound layer of two or more conductive layers, one or more of the constituent layers may "fill" the first and the second hole.

According to one embodiment, the method further comprises, prior to forming the first and second hole, forming a gate dielectric layer (preferably a conformal gate dielectric layer) covering the bottom electrode insulating layer and the protruding portions of the vertical semiconductor structures wherein forming the first and the second hole includes forming the first and the second hole to extend through the gate dielectric layer and the bottom electrode insulating layer. Forming the gate dielectric layer prior to forming the holes facilitates subsequent contacting with the first and second bottom electrode regions.

According to one embodiment the method further comprises: forming a gate level insulating layer embedding gates of the vertical channel transistors and exposing a top portion of the vertical semiconductor structures, forming a set of top electrodes on the top portions, forming an insulating sidewall barrier layer on sidewalls of the top electrodes, forming a top electrode level insulating layer covering the top electrodes, forming a set of vertically extending gate contact holes, each hole exposing a gate and each hole being formed by etching the top electrode level and gate level insulating layers selectively to the insulating sidewall barrier layer, and filling the set of gate contact holes with a conductive gate contact material.

According to the present embodiment the gates may be contacted by vertically extending gate contact portions extending in, possibly tight, spaces between adjacent top electrodes. This is enabled by the presence of the insulating sidewall barrier layer on the top electrodes (i.e. which forms an insulating sidewall spacer on the top electrodes) which ensures at least a minimum amount of electrical insulation between the conductive gate contact material and adjacent top electrodes.

The top electrodes may be covered by a (top electrode level) insulating layer. The insulating sidewall barrier layer may be formed of a different material than the insulating layer covering the top electrodes. This enables etch selectivity during forming holes for the lower contact portions in the insulating layer. I.e. the (top electrode level) insulating layer covering the top electrodes may be etched selectively with respect to the insulating sidewall barrier layer. The insulating sidewall barrier layer may hence act as a sidewall etch barrier layer during the formation of the holes for the gate contacts. This in turn enables formation of gate contacts which in a sense are self-aligned with respect to the top electrodes.

According to one embodiment, forming the set of gate contact holes includes: forming a gate contact mask layer on the top electrode level insulating layer, forming openings in the gate contact mask layer, the openings defining the locations of the gate contact holes, and etching the top electrode level and gate level insulating layers through the openings.

According to one embodiment a width dimension of at least one of the openings is such that the etching through the at least one opening exposes the insulating sidewall barrier layer on a top electrode. One or more of the openings may accordingly be "oversized" without the subsequently formed gate contact portions making electrical contact with a top electrode, due to the presence of the sidewall etch barrier. This relaxes alignment requirements during forming of the openings in the gate contact mask layer.

According to one embodiment the method further comprises forming an upper barrier layer on an upper surface of each top electrode, wherein the etching of the top electrode level and gate level insulating layers is selective to both the insulating sidewall barrier layer and the upper barrier layer. A risk of a gate contact hole exposing a top surface of a top electrode is hence reduced. The upper etch barrier may be formed by a same material as the sidewall etch barrier According to one embodiment the method further comprises: subsequent to forming the top electrode level insulating layer, forming a set of vertically extending top contact holes, each hole exposing a top electrode and each hole being formed by etching the top electrode level insulating layer, and filling the set of top contact holes with a conductive top contact material.

The conductive top contact material and the conductive gate contact material may be formed by or refer to a same conductive contact material. The set of gate contact holes and the set of top contact holes may be filled with the conductive contact material by forming a conductive material layer covering the top electrode level insulating layer and filling the set of gate contact holes and the set of top contact holes.

The method may further comprise transferring a contact pattern in to the conductive material layer to form a set of discrete contacts including gate contacts connected to a gate underneath the set of gate contact holes and top contacts connected to top electrodes underneath the set of contact holes.

BRIEF DESCRIPTION OF THE DRAWINGS

The above, as well as additional objects, features and advantages of the inventive aspects, will be better understood through the following illustrative and non-limiting detailed description, with reference to the appended drawings. In the drawings like reference numerals will be used for like elements unless stated otherwise.

FIGS. 1A-1C schematically illustrate a plan-view, a cross-sectional view in a first direction and a cross-sectional view in a second direction of a semiconductor device comprising bottom electrode regions and vertical channel transistors, according to embodiments.

DETAILED DESCRIPTION OF CERTAIN ILLUSTRATIVE EMBODIMENTS

Figure 2:
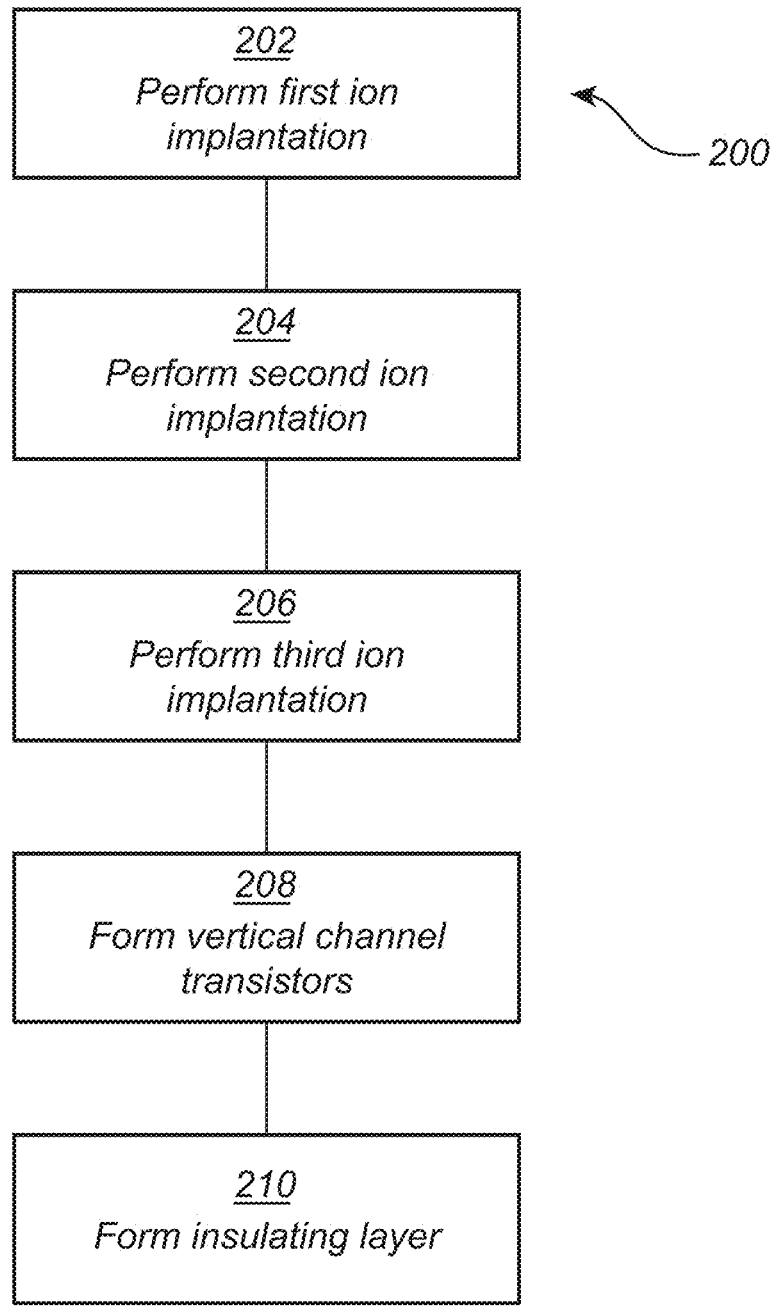
FIG. 2 is a flow chart schematically illustrating a method of forming a semiconductor device, according to embodiments.

With reference to FIG. 1A there is shown a schematic top-view of a portion of a semiconductor device 1. FIG. 1B shows the semiconductor device 1 along the plane of section BB' indicated in FIG. 1A. FIG. 1C shows the semiconductor device 1 along the plane of section AA' indicated in FIG. 1A. The indicated directions X, Y and Z refer to a first horizontal direction, a second horizontal direction and a vertical direction, respectively. It should further be noted that, owing to the schematic nature of the drawings, the relative dimensions of the various structures and layers are not drawn to scale. Rather, the dimensions have been adapted for illustrational clarity and to facilitate understanding of the following description.

The device 1 includes a semiconductor substrate 10. The substrate 10 may be a semiconductor wafer or substrate, for instance a Si substrate, a Ge substrate, a SiGe substrate, a SiC substrate, a SOI substrate, a GeOI substrate, a SiGeOI substrate to name a few examples. The shown region of the substrate 10 forms a doped region of the substrate 10. The substrate 10 may include a Si layer doped with a p-type dopant, such as boron (B), aluminium (Al) or gallium (Ga), for instance using ion implantation. The substrate 10 may be comparably lightly doped to form a p⁻ region or well of the substrate 10.

A first semiconductor bottom electrode region 110 and a first semiconductor bottom electrode region 120 are formed on the substrate 10. The first bottom electrode region 110 includes, in an upper thickness portion 110a thereof, a first region 111, a second region 112 and a third region 113 arranged side-by-side. The second region 112 is arranged between the first region 111 and the third region 113.

The first region 111, the second region 112 and the third region 113 are doped such that a first p-n junction is formed between the first region 111 and the second region 112 and a second p-n junction is formed between the second region 112 and third region 113. The first and second bottom electrode regions 110, 120 may be formed in a Si-layer of the substrate 10. The first region 111 and the third region 113 may be doped with an n-type dopant such as arsenic (As) or phosphorous (P), using ion implantation. The second region 112 may be doped with a p-type dopant such as B, using ion implantation. The first through third regions 111-113 may be comparably heavily doped regions to form $n^{++}$, $p^{++}$, $n^{++}$ regions, respectively.

A connection region 114 is formed in the bottom electrode region 110 underneath the first, second and third regions 111-113. The connection region 114 is formed such that a resistance along an electrical path extending between the first and the third regions 111, 113 via the connection region 114 is lower than a resistance of an electrical path extending between the first and the third regions 111, 113 via the second region 112. In other words, the connection region is formed such that a current path of lowest resistance between the first region 111 and the third region 113 extends through the connection region 114. The connection region 114 is doped with a same type of dopant as the first and third regions 111, 113, for instance an n-type dopant such as As or P. The connection region 114 may be a comparably moderately doped region, to form an $n^+$ region, or a comparably heavily doped region to form an $n^{++}$ region.

Doping concentrations of the first through third regions 111-113, as well as of the connection region 114, may for instance be in the range of $10^{19}$ atoms/cm³ to $10^{21}$ atoms/cm³.

With respect to substrate 10, the first through third regions 111-113, as well as the connection region 114, other dopants than the examples provided above may however also be possible, as well as other types of materials than Si, wherein the substrate/regions may be doped with some other conventional donor/acceptor ion suitable for the chosen semiconductor material.

As shown in the Figures, the connection region 114 is laterally coextensive with the joint region defined by the first region 111, the second region 112 and third region 113, in combination. However, it may also be possible to form the regions 111-114 to obtain a non-coextensive connection region 114. Preferably, the connection region 114 may however present a lateral dimension such that the connection region 114 at least extends from a horizontal position P1 underneath the channel of a first transistor 131 (formed on the first region 111) to a horizontal position P3 underneath a channel of a third transistor 133 (formed on the third region 113).

The second bottom electrode region 120 includes a first region 121, a second region 122, a third region 123 and a connection region 124 corresponding to the regions 111-114 of the first bottom electrode region 110. The above description of the first bottom electrode region 110 accordingly applies correspondingly to the second bottom electrode region 120.

The semiconductor device 1 further comprises an insulating layer 150 laterally surrounding the bottom electrode regions 110, 120. The insulating layer 150 is formed with a thickness, or correspondingly a depth, such that it extends vertically to a level below the connection regions 114, 124. The connection regions 114, 124 are hence electrically insulated from each other. The insulating layer 150 may be formed by a dielectric material such as a silicon oxide material, for instance $SiO_2$, a organo-silicate-glass material or another low-K dielectric material.

The semiconductor device 1 further comprises a set of vertical channel transistors. As schematically indicated in the Figures, a first transistor 131, a second transistor 132 and a third transistor 133 is arranged on the first region 111, the second region 112 and the third region 113, respectively, of the first bottom electrode region 110. A first (or fourth) transistor 141, a second (or fifth) transistor 142 and a third (or sixth) transistor 143 is arranged on the first region 121, the second region 122 and the third region 123, respectively, of the second bottom electrode region 120.

The vertical channel transistors 131-133, 141-143 may include a vertically oriented (i.e. along the direction Z) semiconductor structure, for instance in the form of a vertical nanowire or vertical column. A gate (not shown) may be arranged along a vertical section of each one of the semiconductor structures. A bottom source/drain of each transistor may be formed in the respective region 111-113, 121-123 of the bottom electrodes 110, 120. A top source/drain of each transistor may be formed in a top portion of the respective the semiconductor structure.

The first and third transistors 131, 133, 141, 143 may form NMOS transistors, in which the respective bottom and top source/drains may be heavily doped $n^{++}$ and the respective semiconductor structures may include lightly doped channel regions (p-type, intrinsic or n-type) or not be doped at all. The second transistors 132, 142 may form PMOS transistors, in which the respective bottom and top source/drains may be heavily doped regions ($p^{++}$) and the respective semiconductor structures may include lightly doped channel regions (p-type, intrinsic or n-type) or not be doped at all. A light doping may in these cases refer to a doping level of $10^{17}$ atoms/cm³ or lower The semiconductor device 1 may be used for implementing area-efficient circuitry making use of sets of three transistors having electrically interconnected source/drains. One advantageous example is SRAM circuitry however the semiconductor device 1 may be put to use also in other CMOS-based circuitry, for instance flip-flops, multiplexers or other logic circuitry. The gates and the top source/drains of the transistors may be interconnected to each other and/or to other circuit portions depending on the application.

A method 200 for forming the semiconductor device 1 will now be described in connection with FIGS. 1A-1C and FIG. 2.

Regions of the substrate 10 intended to support the first and the second bottom electrode regions 110, 120 are subjected to a first ion implantation step by a first type of dopant to form doped regions in the substrate 10 (step 202). The implantation may be performed such that the desired doping is obtained down to a depth in the substrate 10 which coincides with an intended vertical level of the connection regions 114, 124, which are to be formed.

The substrate 10 may already prior to the first ion implantation step be doped with a second, opposite type of dopant, to form a doped well in the substrate 10. The well may be formed with a depth in the substrate 10 which extends below an intended vertical level of the connection regions 114, 124, which are to be formed.

A first and a third region of the respective regions doped during the first ion implantation step are subsequently subjected to a second ion implantation step by the first type of dopant, i.e. a dopant of a same type as in the first ion implantation step (step 204). The first and third regions implanted during the second ion implantation step form the first and third regions 111, 113, 121, 123 of the first and second bottom electrode regions 110, 120.

The second region may subsequently be subjected to a third ion implantation step by the second type of dopant, i.e. opposite to the first type of dopant (step 206). The second regions implanted during the third ion implantation step form the second regions 112, 122 of the first and second bottom electrode regions 110, 120.

During the second and third implantation steps 204 and 206, an implantation mask may be formed to cover the second region (in the second step) and the first and third regions (in the third step), respectively. The ion implantation masks may be adapted to counteract ion implantation in the covered region(s). An implantation mask with an appropriate extension may for instance be formed by patterning a nitride-including layer, such as SiN, or some other hard mask material providing a sufficient implantation stopping power. Any suitable conventional patterning technique may be used, such as a litho-etch technique. The implantation masks may be stripped subsequent to the respective ion implantation steps.

The second and third ion implantation steps 204 and 206 may each be performed such that the respective dopants are introduced mainly or only in the upper thickness portion 110a of the bottom electrode regions 110, 120 such that a lower thickness portion with a lower doping concentration remains below the first, second and third regions 111-113, 121-123. The lower thickness portion form the connection region 114, 124 of the respective bottom electrode regions 110, 120.

For instance, the first implantation step 202 may include implanting an n-type dopant such as As or P in a $p^-$ well (for instance B-doped) in the substrate 10 to form $n^+$ regions of the bottom electrode regions 110, 120. The second implantation step 204 may include implanting an n-type dopant such as As or P into the first and third regions in the upper thickness portion of the $n^+$ regions to form first and third $n^{++}$ regions of the bottom electrode regions 110, 120. The third implantation step 206 may include implanting a p-type dopant such as B into the $n^+$ second region to form $p^{++}$ regions of the bottom electrode regions 110, 120. The remaining $n^+$ lower thickness portion of the bottom electrode regions 110, 120 form the connection regions 114, 124 of the bottom electrode regions 110, 120.

As an alternative to doping by ion implantation in steps 202, 204 and 206, doping may also be achieved by plasma doping or solid state doping. Also it should be noted that, in the above, each reference to a p-type dopant may be replaced with an n-type dopant and vice versa. Accordingly, it is also possible to form, in an $n^-$ well of the substrate 10, $p^+$ connection regions 114, 124 extending underneath respective $p^{++}$ first and third regions 111, 113, 121, 123 and $n^{++}$ second regions 112, 122. Further, it should be noted that the above labels "first", "second" and "third" used in connection with the implantation steps merely serves as labels and do not imply a particular ordering. Hence, the "third" implantation step instead may precede the "second" implantation step wherein the second regions 112, 122 may be formed prior to the first and third regions 111, 113, 121, 123.

Subsequent to the ion implantation steps, a first vertical channel transistor 131, a second vertical channel transistor 132 and a third vertical channel transistor 133 is formed on the first region 111, the second region 112 and the third region 113, respectively, and a first vertical channel transistor 141, a second vertical channel transistor 142 and a third vertical channel transistor 143 is formed on the first region 121, the second region 122 and the third region 123, respectively (step 208).

Forming the vertical channel transistors 131-133, 141-143 may include growing a semiconductor layer on top of bottom electrode regions 110, 120. The semiconductor layer may be grown in an epitaxial growth process. The semiconductor layer may for instance be a lightly doped, an undoped or an intrinsically doped (e.g. by an n- or p-type dopant) semiconductor layer. The semiconductor layer may for instance be formed by Si or SiGe. Vertical semiconductor structures may thereafter be formed by etching the semiconductor layer using one or more vertical and anisotropic etch steps. The etching of the semiconductor layer may be preceded with deposition and patterning of a lithographic stack to form mask portions allowing etching of the vertical semiconductor structures. Lithographic stacks and etching processes for forming vertical semiconductor structures is per se known in the art and will therefore not be further described herein. The etching may be stopped when top surfaces of the bottom electrode regions 110, 120 semiconductor substrate 101 are reached.

Gates may be formed to extend around the vertical semiconductor structures, completely (to form wrap-around gates) or partially. Gates may for instance be formed in a replacement-metal gate process. A further technique for forming gates will be described below.

Subsequent to the ion implantation steps, the substrate 10 is etched to form trenches surrounding each one of the bottom electrode regions 110, 120. The trenches are subsequently filled with an insulating material to form the insulating layer 150 (step 210). The forming of the insulating layer 150 may be performed prior to forming the vertical channel transistors, or between process steps performed for forming the vertical channel transistors. The insulating layer 150 may for instance be formed subsequent to forming the vertical semiconductor structures but prior to gate and top electrode formation.

As an alternative to the first ion implantation step 202, a semiconductor layer (of for instance Si), in-situ doped with the first type of dopant, may be epitaxially grown on the substrate 10. Thereby, a doped region may be formed on the substrate which subsequently may be subjected to the ion implantation steps 204 and 206 to form first, second and third regions 111-113, 121-123 in the epitaxially grown semiconductor layer. The epitaxially grown semiconductor layer may subsequently be etched to form trenches splitting the grown semiconductor layer into a number of discrete (i.e. disconnected) bottom electrode regions 110, 120 on the substrate 10. The trenches may subsequently be filled with the insulating material to form the insulating layer 150.

Figure 3A:
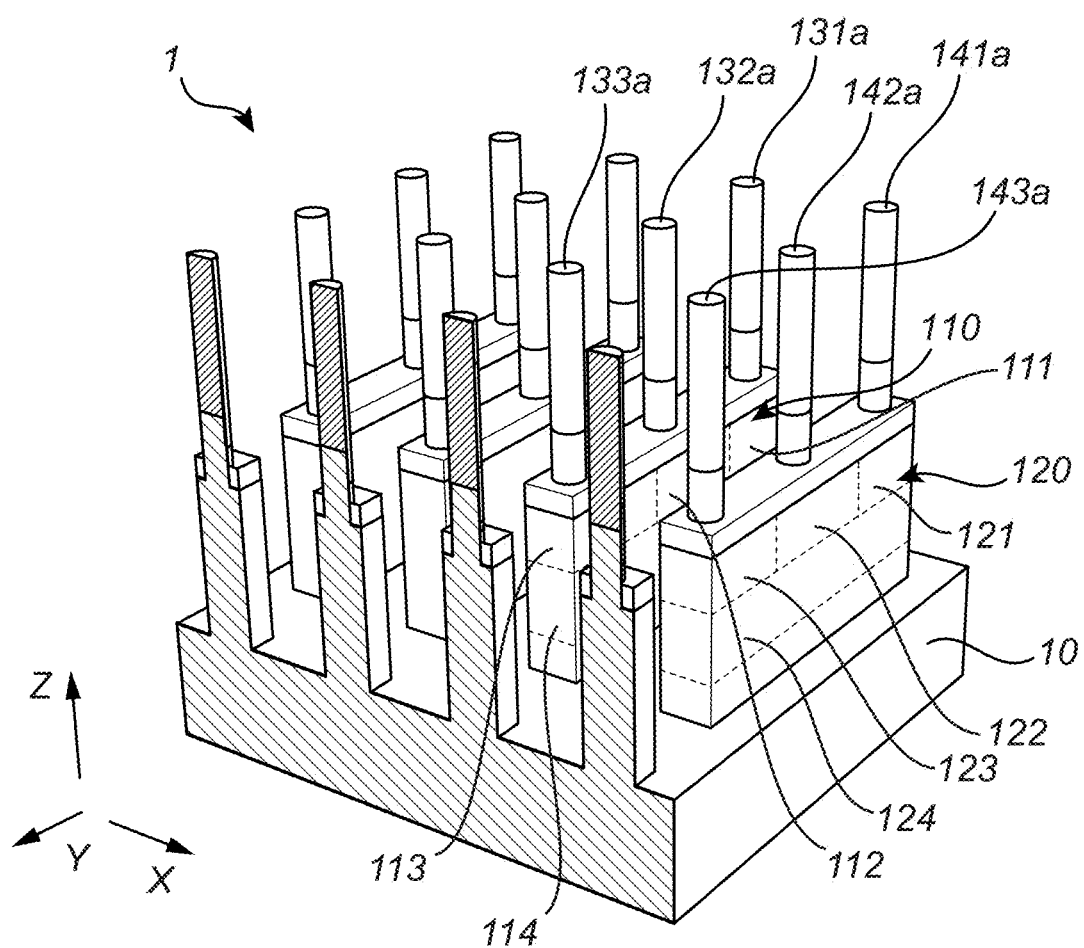
FIGS. 3A-3O schematically illustrate a method of forming s static random access memory (SRAM) device comprising bottom electrode regions and vertical channel transistors, according to embodiments.
Figure 3B:
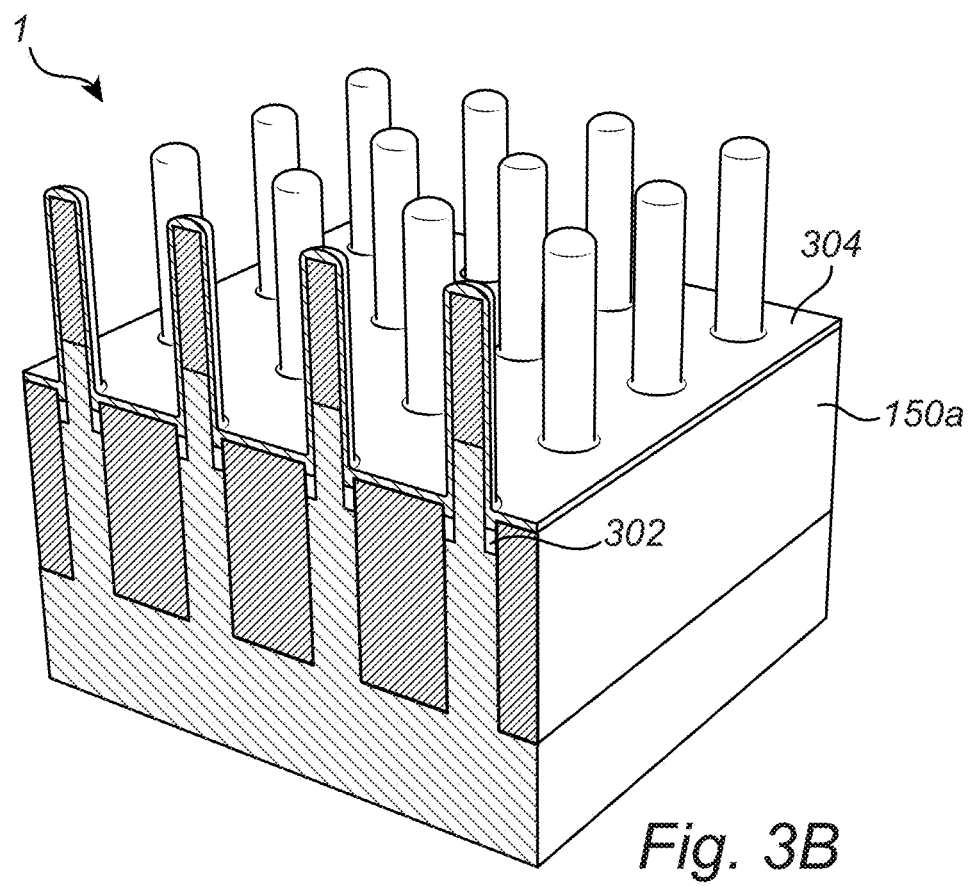
Figure 3C:
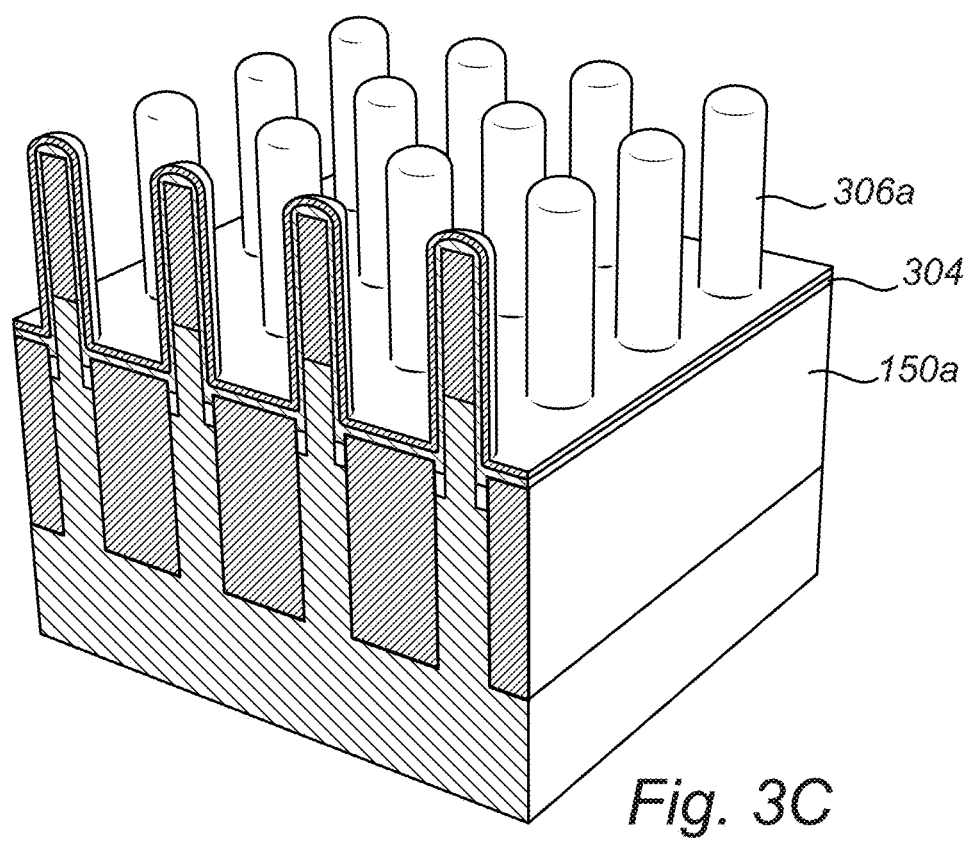
Figure 3D:
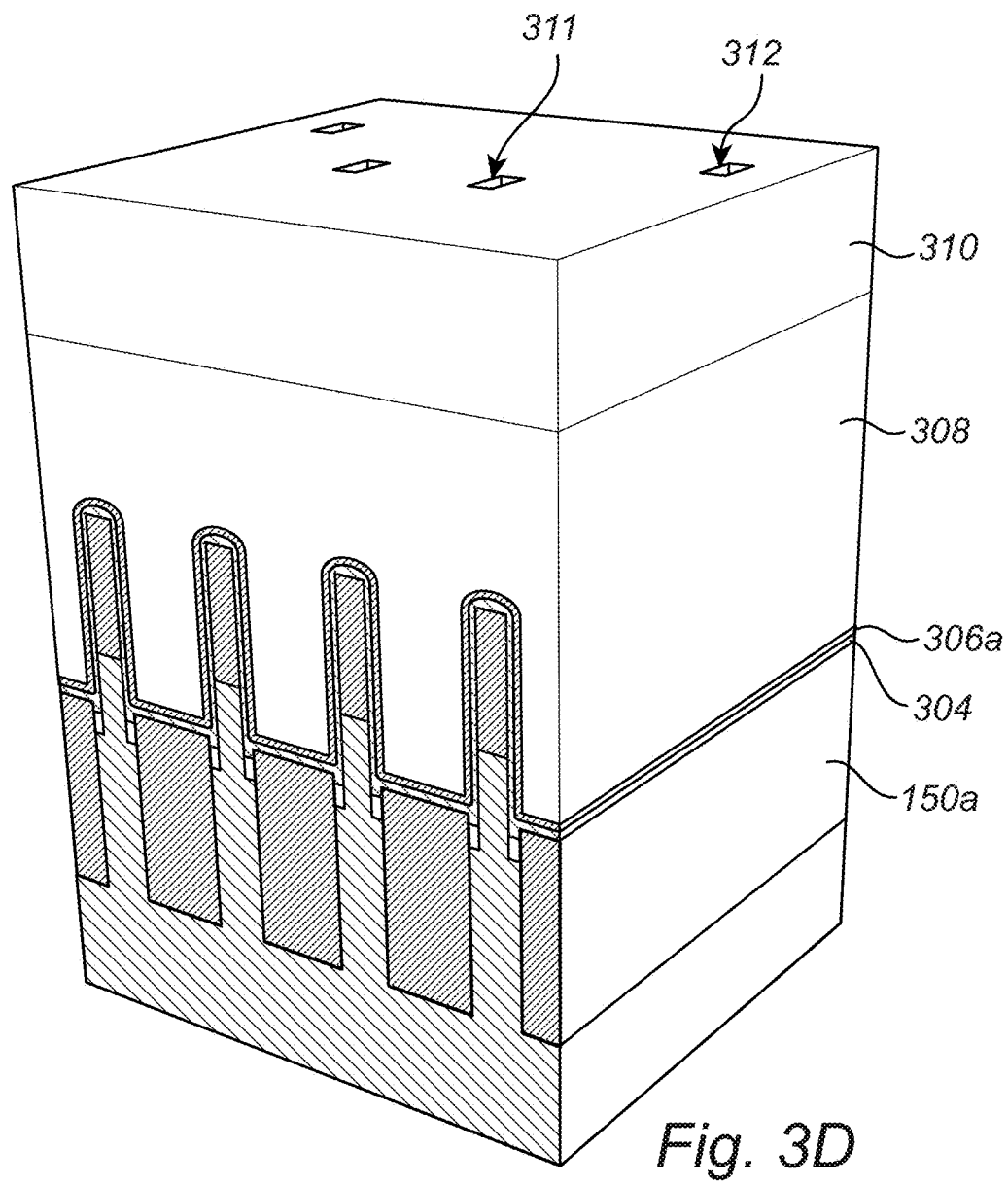
Figure 3E:
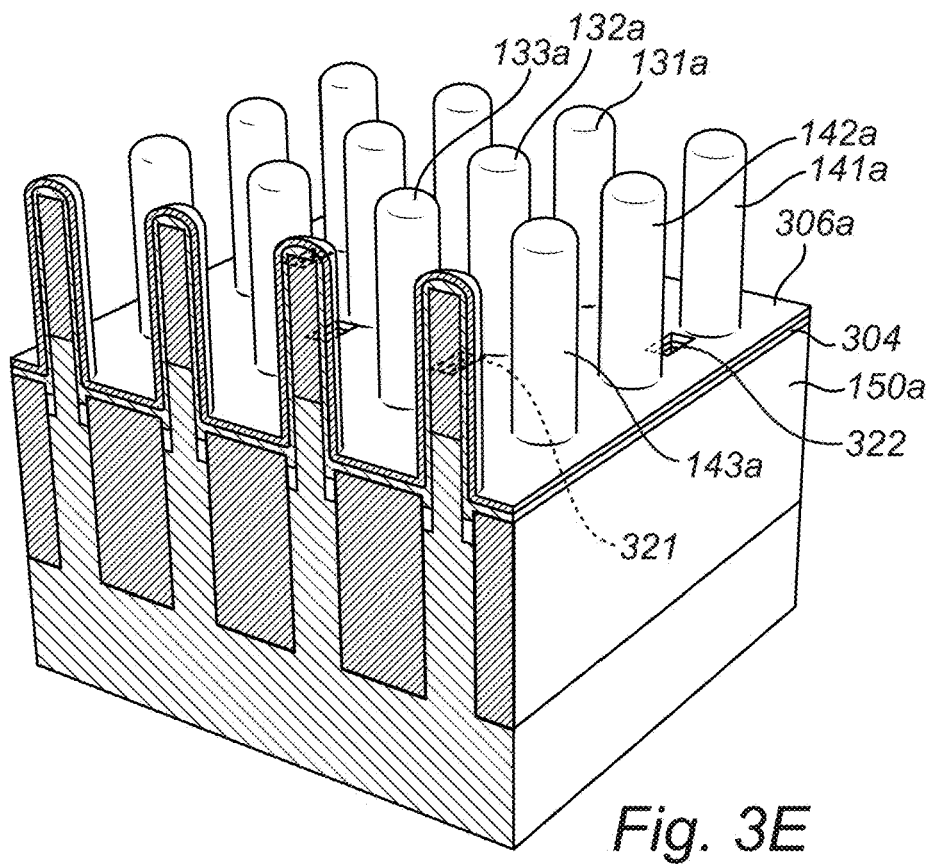
Figure 3F:
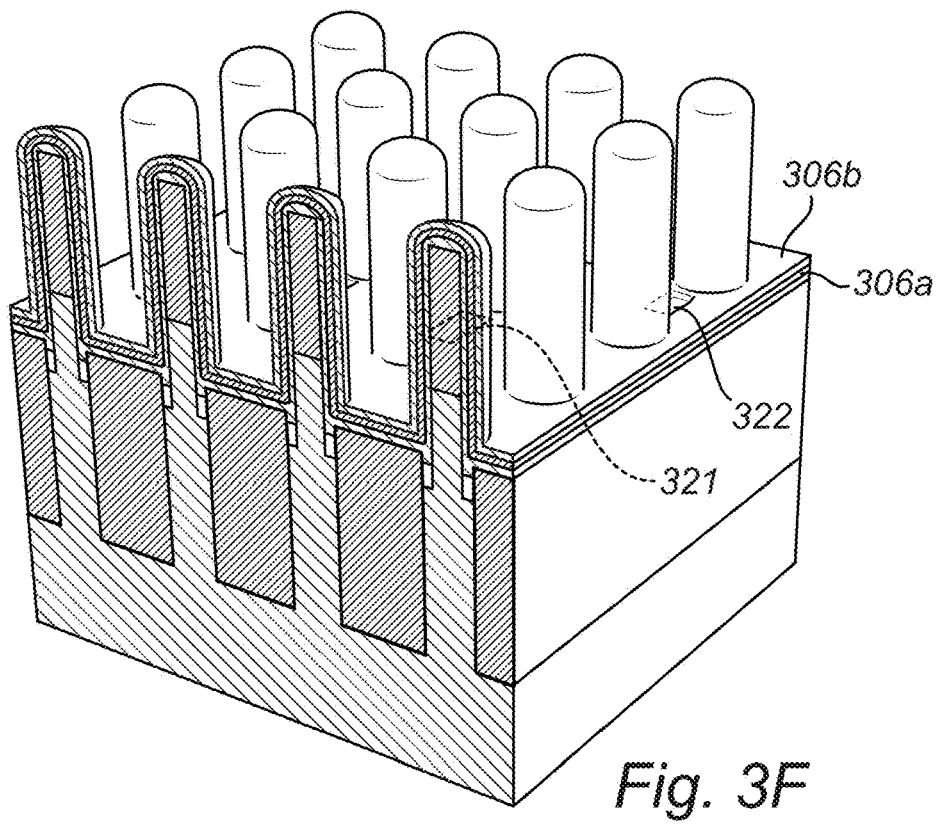
Figure 3G:
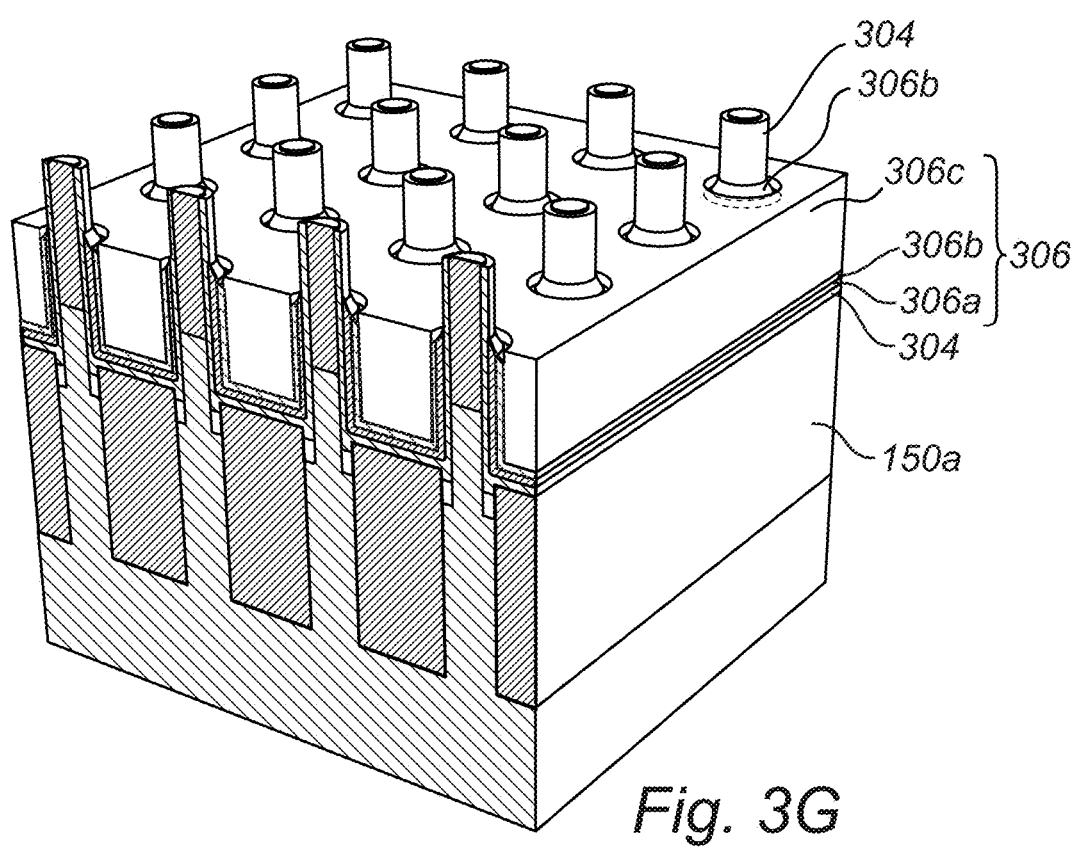
Figure 3H:
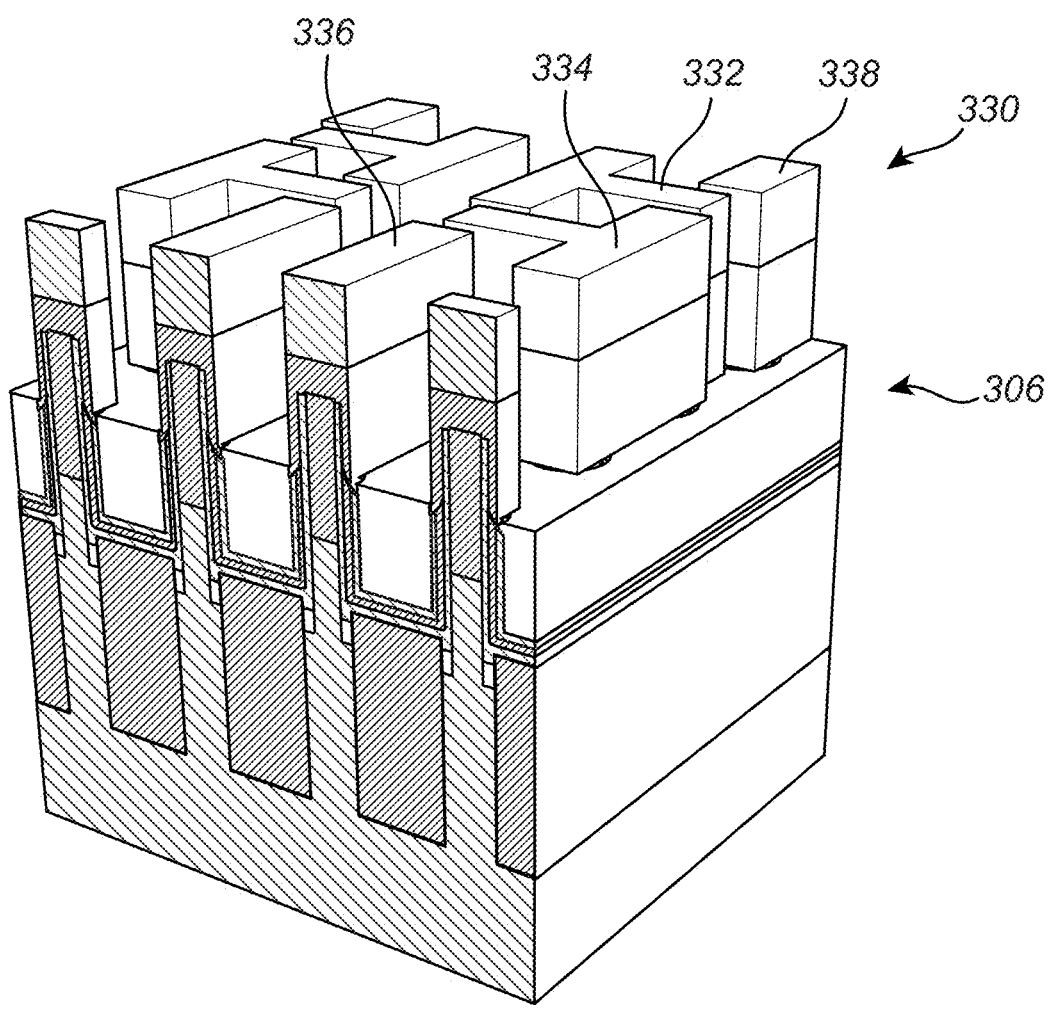
Figure 3I:
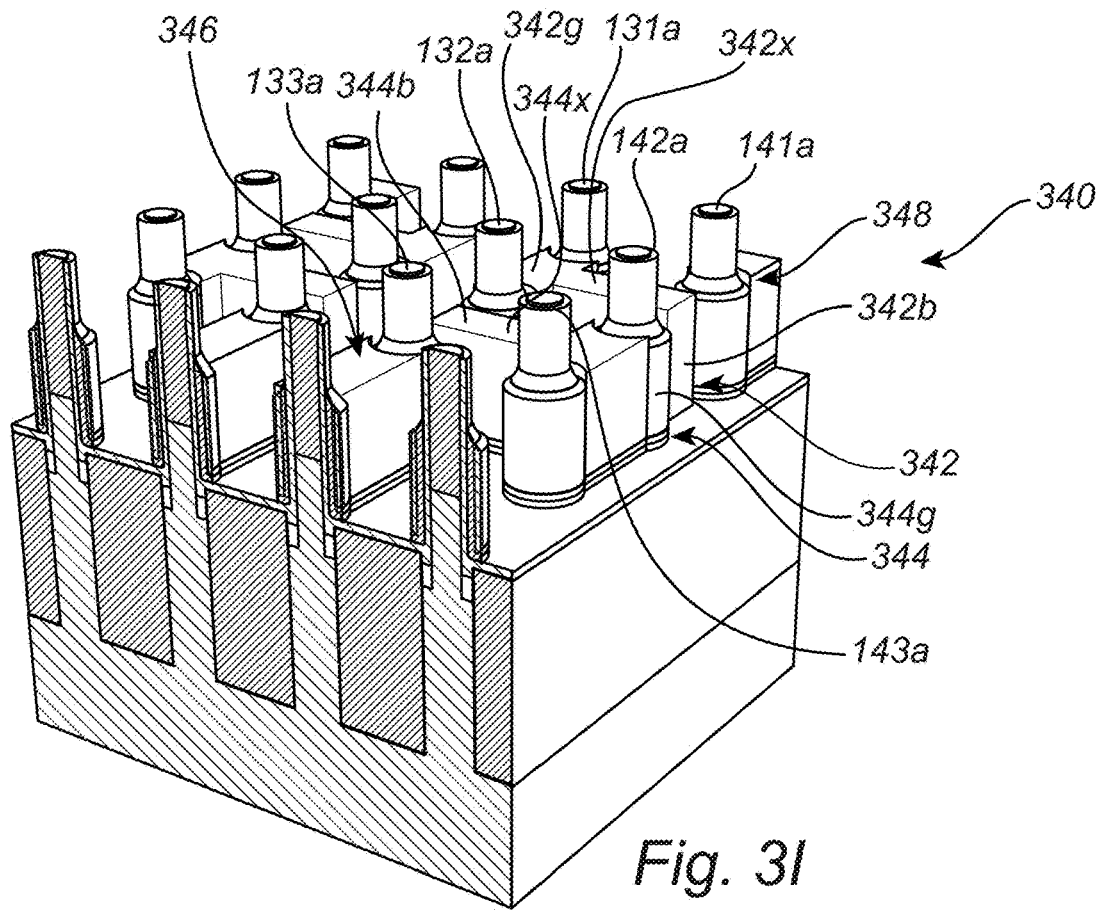
Figure 3J:
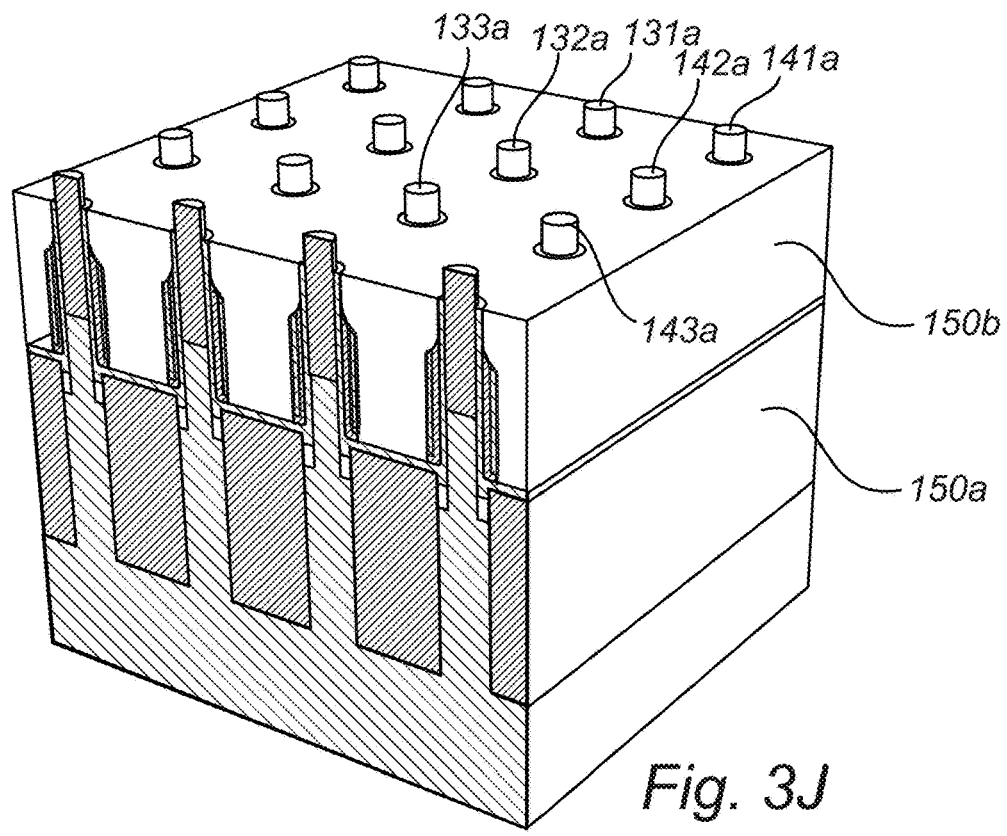
Figure 3K:
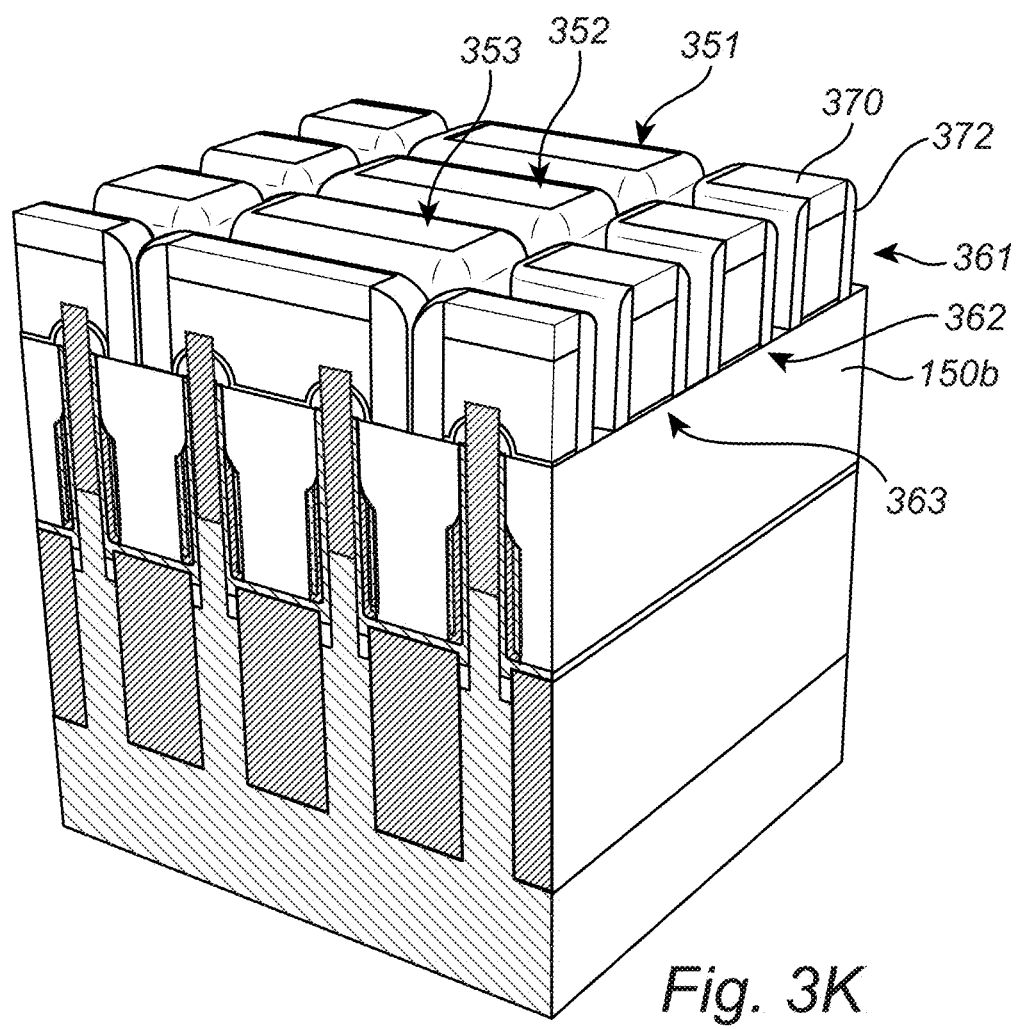
Figure 3L:
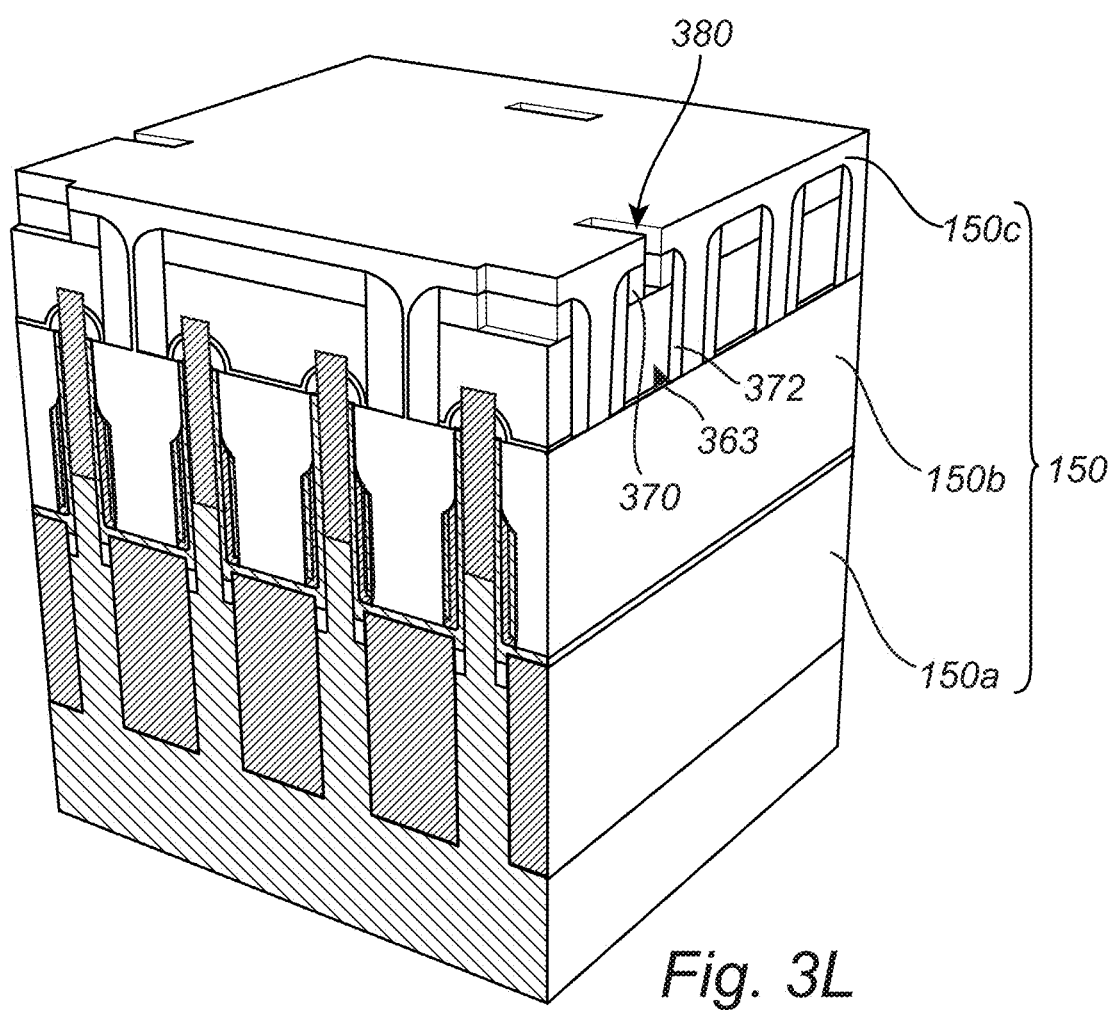
Figure 3M:
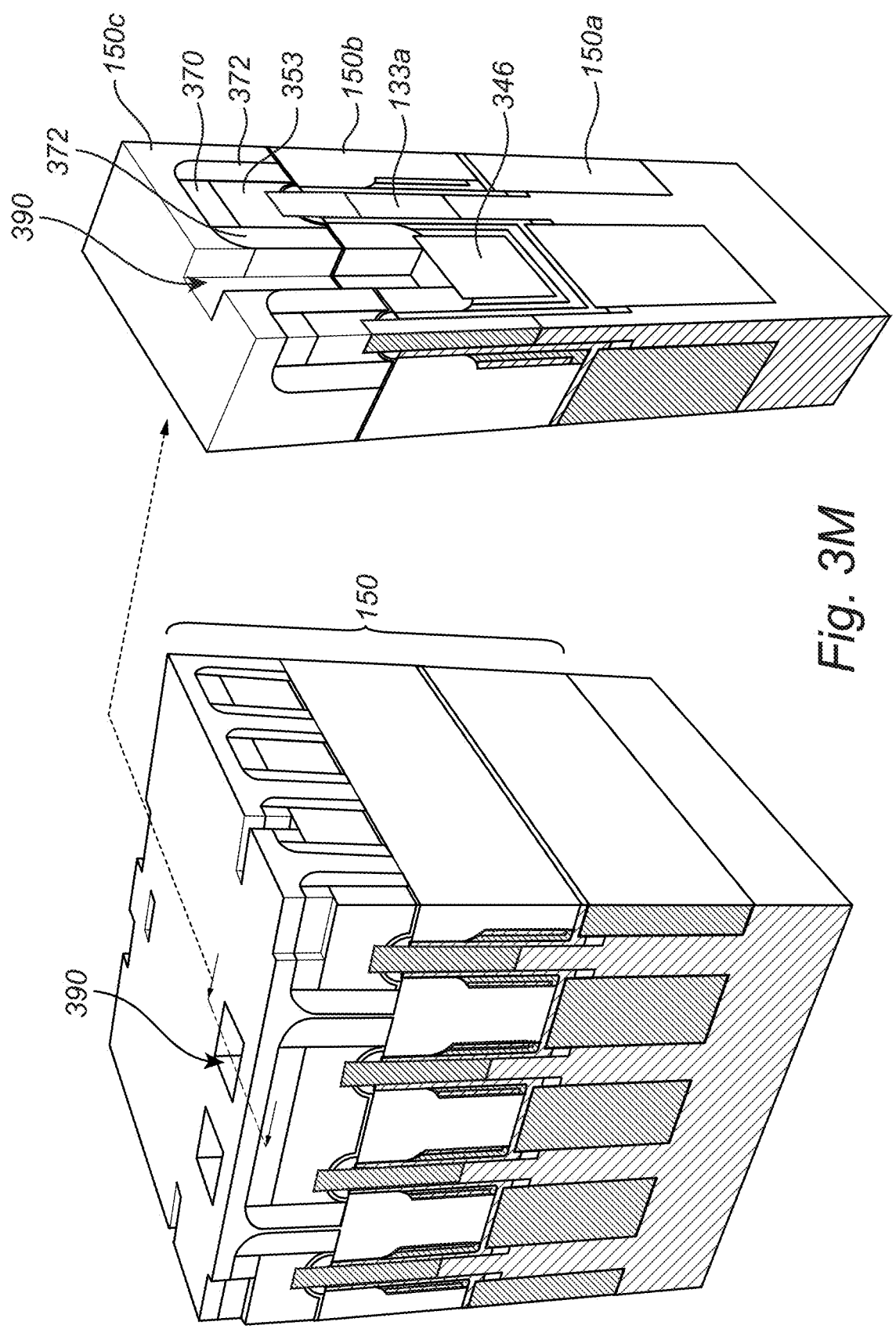
Figure 3O:
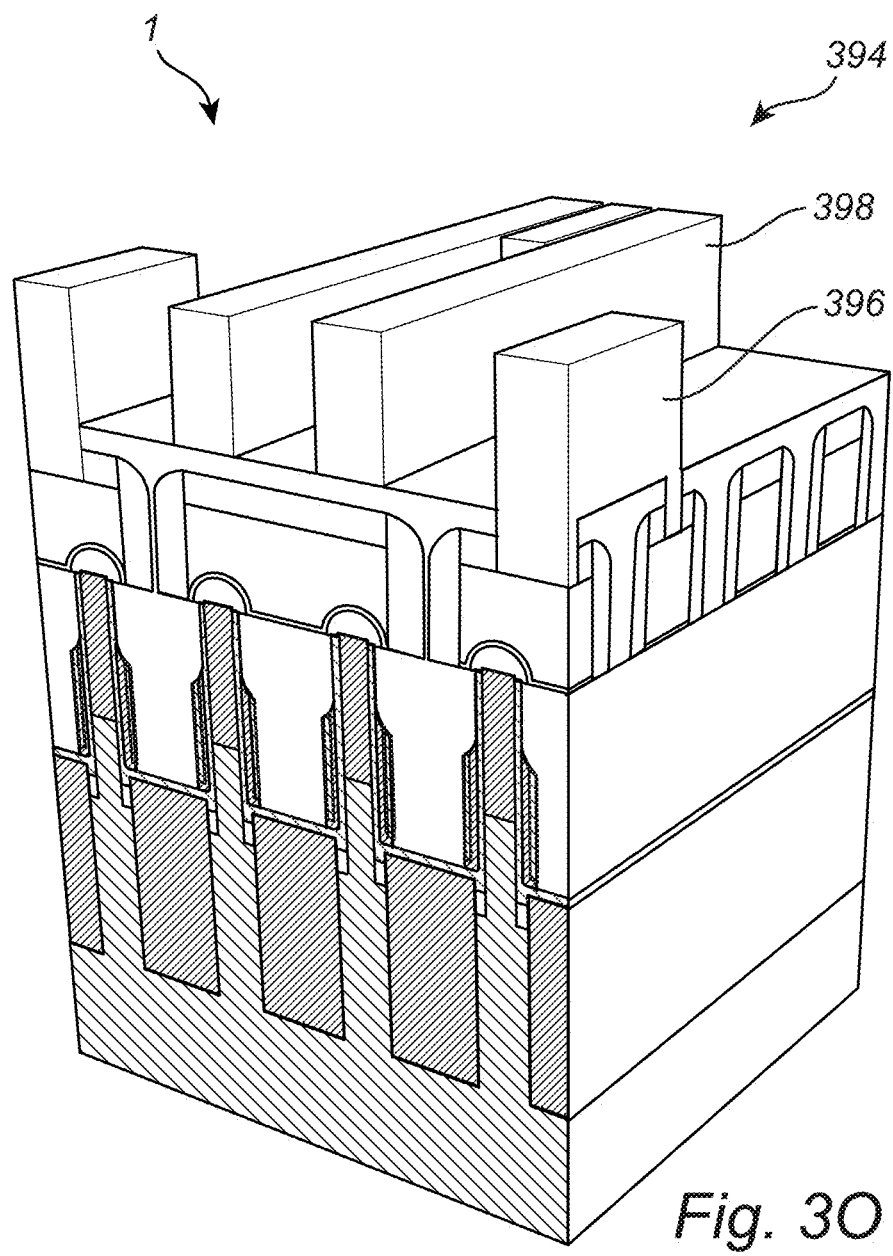

A method for forming a semiconductor device in the form of an SRAM will be disclosed with reference to FIGS. 3A-3O. FIGS. 3A-3O show a perspective view of a section of the semiconductor device 1 at various stages of the method. The device 1 may extend laterally or horizontally beyond the illustrated section. The illustrated planes of section extending through the device 1 are common to all FIGS. 3A-3O unless otherwise is stated. It is noted that the relative dimensions of the shown structures, for instance the relative thickness of layers, is merely schematic and may, for the purpose of illustrational clarity, differ from a physical structure.

FIG. 3A shows the semiconductor device 1 at a stage where a plurality of bottom electrode regions, including the bottom electrode regions 110, 120 have been formed on the substrate 10. The bottom electrode regions 110, 120 have further been formed to include the respective first, second and third regions 111-113/121-123 as well as connection regions 114/124 extending underneath the first, second and third regions 111-113/121-123, respectively. On the bottom electrode regions 110, 120, vertical semiconductor structures 131a-133a, 141a-143a have been formed, which represent initial structures of the vertical transistors 131-133, 141-143 which are to be formed. As shown, trenches have been formed to surround the bottom electrode regions 110, 120 by etching the substrate 10.

In FIG. 3B a bottom electrode insulating layer 150a has been formed on the semiconductor substrate 10. The bottom electrode insulating layer 150a covers the first and second bottom electrode regions 110, 120. The vertical semiconductor structures 131a-133a, 141a-143a protrude from the bottom electrode insulating layer 150a to present respective protruding portions. The function of the bottom electrode insulating layer 150a corresponds to that of the above described insulating layer 150 shown in FIGS. 1a-1c. As will be appreciated the bottom electrode insulating layer 150a further provides an offset between the gate portions to be formed and the bottom electrode regions 110, 120. Electrical insulation between the gate portions and the bottom electrode regions 110, 120 may hence be provided.

The bottom electrode insulating layer 150a may be formed by a dielectric material. The bottom electrode insulating layer 150a may include a silicon oxide material, for instance $SiO_2$, an organo-silicate-glass material or another low-K dielectric material. The bottom electrode insulating layer 150a may also include a stack of layers of different dielectric materials. The bottom electrode insulating layer 150a may be deposited by any conventional deposition process, such as chemical vapor deposition (CVD). The bottom electrode insulating layer 150a may be deposited to completely cover the vertical semiconductor structures 131a-133a, 141a-143a. The thickness of the bottom electrode insulating layer 150a may thereafter be reduced until protruding portions of the vertical semiconductor structures 131a-133a, 141a-143a of a desired height have been obtained. The thickness reduction may be achieved by selectively etching the bottom electrode insulating layer 150a with respect to the vertical semiconductor structures 131a-133a, 141a-143a.

The bottom electrode insulating layer 150a may form part of a compound insulating layer 150 which will cover the bottom electrode regions 110, 120 and the vertical channel transistors 131-133, 141-143 at a final stage of the process. The bottom electrode insulating layer 150a hence refers to the sub-layer of the final compound insulating layer 150 which sub-layer embeds the bottom electrode regions 110, 120.

As indicated, a liner 302 may be formed on the upper surface of the bottom electrode regions 110, 120. The liner 302 may be a nitride-based liner, such as SiN or some other insulating or dielectric material different from the material of the bottom electrode insulating layer 150a. The liner 302 may be formed on the substrate 10 prior to the aforementioned etching of the trenches. Portions of the liner 302 remaining on the protruding portions of the vertical semiconductor structures 131a-133a, 141a-143a may be removed after the bottom electrode insulating layer 150a has been formed with its final thickness. For the purpose of the following description, the liner 302 may be considered to form part of the bottom electrode insulating layer 150a.

In FIG. 3B a conformal gate dielectric layer 304 has further been formed. The gate dielectric layer 304 covers the bottom electrode insulating layer 150a and the protruding portions of the vertical semiconductor structures 131a-133a, 141a-143a. As shown, the gate dielectric layer 304 covers the sidewall surfaces of the vertical semiconductor structures 131a-133a, 141a-143a.

The gate dielectric layer 304 may be deposited as a conformal thin film. The gate dielectric layer 304 may be formed by a dielectric material such as a high-K dielectric material. The gate dielectric layer 304 may for instance be formed by $HfO_2$, $ZrO_2$, $Al_2O_3$, or other rare-earth oxides or metal oxide silicates such as $HfSiO_x$, $YSiO_x$, or $LaSiO_x$. The gate dielectric layer 304 may be formed by one layer of a dielectric material or by a stack of different dielectric materials. The gate dielectric layer 304 may be deposited by any conventional deposition process, for instance by atomic layer deposition (ALD).

In FIG. 3C a conformal work function metal (WFM) layer 306 has been formed. The WFM layer 306a covers the gate dielectric layer 304 on the protruding portions of the vertical semiconductor structures 131a-133a, 141a-143a and on the bottom electrode insulating layer 150a. The WFM layer 306a may form a first layer of a compound gate level conductor 306 which is to be formed. The WFM layer 306 may be formed by one metal material or by a stack of layers of one or more metal materials. The WFM layer 306 may for instance be formed by a p-type work function metal such as TiN, TaN, TiTaN or by a stack of layers of such materials. The WFM layer 306 may also be formed by an n-type work function metal such as Al, TiAl, TiC, or TiAlC or by a stack of layers of such materials. The WFM layer 306 may be deposited by any conventional deposition process, for instance by ALD, CVD or tilted physical vapor deposition (PVD).

In FIG. 3D a mask layer 308 has been formed to cover the protruding portions of the vertical semiconductor structures 131a-133a, 141a-143a. As shown the mask layer 308 covers the WFM layer 306a. The mask layer 308 may include, for instance a spin-on-carbon (SOC) or other carbon-based layer. The mask layer 308 may include further (not shown) sub-layers such as Si-including antireflection layer. A photo-resist layer 310 has been formed on the mask layer 308. Openings have been patterned in the photo-resist layer 310 in a lithographic process and transferred into the mask layer 308 by an anisotropic etch to form holes 311, 312. The positions of the holes 311, 312 define the positions of first and the second holes 321, 322, respectively, which are to be formed above the first and the second bottom electrode regions 110, 120, respectively.

In FIG. 3E the first hole 321 exposing the first bottom electrode region 110 and the second hole 322 exposing the second bottom electrode region 120 have been formed. The holes 321, 322 extend vertically through the insulting layer 150a. The portion of the first bottom electrode region 110 exposed by the first hole 321 forms a bottom surface of the first hole 321. The portion of the second bottom electrode region 120 exposed by the second hole 322 forms a bottom surface of the second hole 322.

The first hole 321 is formed at a position between the vertical semiconductor structures 132a, 133a. The first hole 321 exposes the p-n junction between the second and third regions 112, 113 of the first bottom electrode region 110. The second hole 322 is formed at a position between the vertical semiconductor structures 141a, 142a. The second hole 322 exposes the p-n junction between the first and second regions 121, 122 of the second bottom electrode region 120.

The holes 321, 322 may be formed by transferring the holes 311, 312 in the mask layer 308 into the insulating layer 150a by etching through the holes 321, 322, for instance using an anisotropic dry etching process. The etching process may be of any type allowing etching of the insulating layer 150a selectively to the materials of the mask layer 308. For instance, a CF-based etching chemistry may be used.

The holes 321, 322 extend also through the WFM layer 306a and the gate dielectric layer 304. If a liner 302 is present, the holes 321, 322 may extend also through the liner 302. The process conditions and/or the chemistries of the etching process may be varied during the etching of the holes 321, 322 to enable opening of the WFM layer 306a, the gate dielectric layer 304 and the liner layer 302, if present. For instance, a Cl-based etching chemistry and/or a F-based etching chemistry may be used.

In FIG. 3F a conformal metal contact layer 306b has been formed on the protruding portions of the vertical semiconductor structures 131a-133a, 141a-143a and in the first and second hole 321, 322. The contact layer 306b covers the sidewall and bottom surfaces of the holes 321, 322. The contact layer 306b hence abuts and electrically contacts the second p-n junction and the first p-n junction of the first bottom electrode region 110 and the second bottom electrode region 120, respectively.

The contact layer 306b covers also the WFM layer 306a. The contact layer 306b accordingly forms a second layer of the compound gate level conductor 306. The contact layer 306b may be formed by one metal material or by a stack of layers of one or more metal materials. The contact layer 306b may for instance be formed by a metal providing a low-resistance connection with the bottom electrode regions 102, 104. The contact layer 306b may for instance be formed by Ti, TiN or WN. The contact layer 306b may be deposited by any conventional deposition process, for instance by ALD, CVD or PVD.

In FIG. 3G a metal fill layer 306c has been formed on the contact layer 306b. The fill layer 306c embeds the protruding portions of the vertical semiconductor structures. The fill layer 306c may further fill a remaining space in the first and the second hole 321, 322 unless the holes already are completely filled by the contact layer 306b. The fill layer 306c forms a third layer of the compound gate level conductor 306. The fill layer 306c may be formed by one metal material or by a stack of layers of one or more metal materials. The fill layer 306c may for instance be formed by a metal having a sufficient conductivity and fill properties. The fill layer 306c may for instance be formed by W, Al, Co, Ni, Ru or an alloy of two or more of the materials. The fill layer 306c may be deposited by any conventional deposition process, for instance by CVD or by electro-plating.

Subsequent to depositing the metal fill layer 306c, the layers 306a-c of the compound gate level conductor 306 have been removed from upper portions of the vertical semiconductor structures by reducing a thickness of the gate level conductor 306. Due to the vertical orientation of the channel structures, the gate length for the vertical semiconductor structures is defined by the thickness of the gate level conductor 130, i.e. the dimension along the vertical direction Z.

Depending on the materials and composition of the gate level conductor 306, the thickness reduction may include a number of different process steps such as polishing, for instance by Chemical Mechanical Polishing (CMP), and etching. If the layers of the gate level conductor 306 may be etched at a substantially same rate by a common etching chemistry a single etch step may suffice. Alternatively, an etching process including a number of etching steps may be used. The etching process(es) are preferably selective with respect to the gate dielectric layer 304 wherein the vertical semiconductor structures may be protected from the etching chemistries used during the thickness reduction. Suitable etching processes for the various above-mentioned material examples of the layers 306a-c are known to the skilled person. By way of example, suitable etching chemistries include Cl-based etching chemistry and/or chlorine oxide-based etching chemistry and/or F-based etching chemistry.

As an alternative to the above described processes for forming the compound gate conductor layer 306 in a number of non-consecutive deposition process steps, it is also possible to form a gate level conductor 306 in a single deposition process (i.e. as a single material layer) or in a number of consecutive deposition process steps (i.e. as a compound layer). The gate conductor layer 306 may in such a case be formed subsequent to forming the holes 321, 322.

In FIG. 3H an etch mask 330 has been formed above the gate level conductor 306. The etch mask 330 includes a number of discrete mask portions 332, 334, 336, 338. Each mask portion defines the horizontal position and horizontal extension of a discrete pattern part of a conductive pattern that is to be formed from the gate level conductor 306.

The etch mask 330 may be formed by depositing an etch mask layer covering the gate level conductor 306. The etch mask layer may be a conventional lithographic stack. The mask layer may include a stack of layers including for instance a SOC layer or other carbon-based layer and optionally further sub-layers such as Si-including antireflection layer. The mask layer may be patterned to include a gate level pattern using a conventional litho-etch process, thereby forming the discrete mask portions 332, 334, 336, 338 as shown in FIG. 3H.

The etch mask 306 includes a first discrete mask portion 332 for defining a first pattern part 342 and a second discrete mask portion 334 for defining the second pattern part 344 (shown in FIG. 3I).

The first discrete mask portion 332 includes a first sub-portion covering the first and second vertical semiconductor structure 131a, 132a and a portion of the gate level conductor 306 extending about the first and second vertical semiconductor structures 131, 132. The first discrete mask portion 332 further includes second sub-portion covering a portion of the gate level conductor 306 filling the second hole 322 (which is hidden from view in FIG. 3H). The first discrete mask portion 332 further includes a third sub-portion extending between the first and second sub-portions.

The second discrete mask portion 334 includes a first sub-portion covering the second and vertical semiconductor structure 142a, 143a and a portion of the gate level conductor 306 extending about the second and vertical semiconductor structure 142a, 143a. The second discrete mask portion 334 further includes a second sub-portion covering a portion of the gate level conductor 306 filling the first hole 321. The second discrete mask portion 144 further includes a third sub-portion extending between the first and second sub-portions.

The etch mask 140 further includes a third discrete mask portion 336 for defining a third pattern part 346 and a fourth discrete mask portion 338 for defining a fourth pattern part 348.

The third discrete mask portion 336 covers the third vertical semiconductor structure 133a and a portion of the gate level conductor 306 extending about the third vertical semiconductor structure 133a.

The fourth discrete mask portion 338 covers the first vertical semiconductor structure 141a and a portion of the gate level conductor 306 extending about the first vertical semiconductor structure 141a.

As indicated in FIG. 3H the third and fourth discrete mask portions 336, 338 may also cover a respective adjacent vertical semiconductor structure extending from a respective adjacent bottom electrode region. Thereby gates common to channel structures on adjacent vertical semiconductor structures may be formed. This configuration of the mask portions 336, 338 is however optional and the particular extension of the mask portions 336, 338 may be varied depending on the type of circuitry that is to be formed.

In FIG. 3I the pattern of the etch mask 330 has been transferred into the gate level conductor 306 by etching the gate level conductor 306 in regions region exposed by the etch mask 330. A conductive pattern 340 including a set of discrete pattern parts 342, 344, 346, 348 has thereby been formed on the insulating layer 150a. As shown, each pattern part 342, 344, 346, 348 is formed as a single piece. The etch mask 330 has subsequently been removed. The etching of the gate level conductor 306 may be performed by an etching process including any of the etching chemistries discussed above, in connection with the thickness reduction of the gate level conductor 306. The etching of the gate level conductor 306 may be stopped when the gate level dielectric 304 is exposed or when the insulating layer 150a is exposed.

The first pattern part 342 includes a first gate portion 342g wrapping around the vertical semiconductor structures 131a and 132a. The first pattern part 342 includes a first bottom electrode contact portion 342b arranged in the second hole 322 and protruding therefrom. The first pattern part 342 includes a first cross-coupling portion 342x extending between the first bottom electrode contact portion 342b and the first gate portion 342g.

The second pattern part 344 includes a second gate portion 344g wrapping around the second and third vertical semiconductor structures 142a, 143a. The second pattern part 344 includes a second bottom electrode contact portion 344b arranged in the first hole 321 and protruding therefrom. The second pattern part 344 includes a second cross-coupling portion 344x extending between the second bottom electrode contact portion 344b and the second gate portion 344g.

The first gate portion 342g is accordingly electrically connected to the second bottom electrode region 120 (at the first p-n junction thereof) via the first cross-coupling portion 342x and the first bottom electrode contact portion 342b. Correspondingly, the second gate portion 344g is electrically connected to the first bottom electrode region 110 (at the second p-n junction thereof) via the second cross-coupling portion 344x and the second bottom electrode contact portion 344b.

The third pattern part 346 includes a gate portion wrapping around the vertical semiconductor structure 133a (and as shown optionally also a portion wrapping around a vertical semiconductor structure on an adjacent bottom electrode region). The fourth pattern part 348 includes a gate portion wrapping around the vertical semiconductor structure 141a (and as shown optionally also a portion wrapping around a vertical semiconductor structure on an adjacent bottom electrode region).

In FIG. 3J a gate level insulating layer 150b embedding the pattern parts 342, 344, 346, 348 has been formed. The gate level insulating layer 150b is formed such that top portions of the vertical semiconductor structures 131a-133a, 141a-143a protrude above the upper surface of the insulating layer 150b. As will be appreciated the insulating layer 150b provides an offset between the gates and the top electrodes, which are to be formed. Electrical insulation between the gates and the top electrodes may hence be provided.

The gate level insulating layer 150b may be formed by a material of a same type of the bottom electrode level insulating layer 150a and be formed using a same type of deposition process.

The insulating layer 150b may be deposited to completely cover the vertical semiconductor structures 131a-133a, 141a-143a. The thickness of the insulating layer 150b may thereafter be reduced until the vertical semiconductor structures protrude above the insulating layer 150b by a desired amount. The thickness reduction may be achieved by selectively etching the insulating layer 150b with respect to the vertical semiconductor structures 131a-133a, 141a-143a. During the thickness reduction, portions of the gate dielectric layer 304 may also be stripped from the top portions of the vertical semiconductor structures 110.

The gate level insulating layer 150b may form part of a compound insulating layer 150 which will cover the bottom electrode regions 110, 120 and the vertical channel transistors 131a-133a, 141a-143a at a final stage of the process. The gate level insulating layer 150b hence refers to the sub-layer of the final compound insulating layer 150 which sub-layer embeds the gate level conductive pattern 340.

Subsequently, ion implantation may be performed in the protruding portions of the vertical semiconductor structures 131a-133a, 141a-143a to form top source/drains in accordance with the channel types of devices. The protruding portions of the first and third vertical semiconductor structures 131a, 141a, 133a, 143a may be doped with an n-type dopant, and the protruding portions of the second channel structures 132a, 142a may be doped with a p-type dopant, or vice versa as the case may be. The source/drain formation may complete the formation of the vertical channel transistors 131-133, 141-143.

In FIG. 3K a set of top electrodes have been formed at the top source/drains of the vertical channel transistors 131-133, 141-143. First through third top electrodes 351-353 are formed at the transistors 131-133, respectively. First through third top electrodes 361-363 are formed at the transistors 141-143, respectively.

As shown in FIG. 3K, the top electrodes 351-353 may be formed to contact also source/drains of transistor devices on an adjacent bottom electrode region. Top electrodes may accordingly be shared between vertical semiconductor structures of different bottom electrodes. This configuration of the top electrodes is however optional and their particular extension may be varied depending on the type of circuitry that is to be formed.

At least some of the top electrodes may be formed with a horizontal dimension which is smaller than a horizontal dimension of the underlying pattern part such that the pattern parts may protrude outside the top electrode, as viewed along the vertical direction. This enables subsequently formed gate contact holes to be formed to expose upper surfaces of the pattern parts.

The set top electrodes may be formed by depositing a top electrode layer including one or more metal layers and covering the top source/drains of the transistors 131-133, 141-143 and the insulating layer 150b. The top electrode layer may be covered with an insulating upper barrier layer 370. The insulating upper barrier layer 370 may for be formed of a nitride-based material such as SiN or SiCN, however non-nitride based materials may also be used such as SiCO. For the purpose of a subsequent etching of holes in the (compound) insulating layer 150, the material of the upper barrier layer 370 may be chosen to allow etching of the insulating layer 150 selective to the upper barrier layer 370.

A top electrode mask layer (not shown) may be formed to cover the top electrode layer and the upper barrier layer 370. The mask layer may include a stack of layers including for instance a SOC layer or other carbon-based layer and optionally further sub-layers such as Si-including antireflection layer. The mask layer may be patterned to include an electrode pattern using a conventional litho-etch process. The top electrode pattern may be transferred into the top electrode layer to form the set of top electrodes, each top electrode being provided with a respective remaining portion of the insulating upper barrier layer 370. An etching process including a number of etching steps may be used to allow etching of the upper barrier layer 370 and subsequently the top electrode layer. Suitable etching chemistries may include Cl-based etching chemistry and/or chlorine oxide-based etching chemistry and/or F-based etching chemistry.

As shown in FIG. 3K an insulating sidewall barrier layer 372 has been formed on sidewalls of the top electrodes 351-353, 361-363. The sidewall surfaces and upper surfaces of the top electrodes are hence completely covered by the upper and sidewall barriers layers 370, 372.

The insulating sidewall barrier layer 372 may be formed by forming a conformal barrier layer (not shown) covering the insulating layer 150b and the top electrodes 351-353, 361-363. By performing an anisotropic and vertical etch of the conformal barrier layer, barrier layer portions may be removed from horizontally oriented surfaces while preserving barrier layer portions on the sidewalls of the top electrodes 138. The sidewall barrier layer 372 may be formed by any one of the materials discussed in connection with the upper barrier layer 370. The sidewall barrier layer 372 may be deposited by ALD. The sidewall barrier layer 372 is formed with a thickness such that, following the vertical etching thereof, the insulating layer 150b is exposed in gaps formed between sidewall barrier layers 372 of adjacent top electrodes.

With reference to FIG. 3L, a top-electrode level insulating layer 150c has been formed to cover the gate level insulating layer 150b and the top electrodes 351-353, 361-363. The top-electrode level insulating layer 150c may be formed as a planarization layer. The top-electrode level insulating layer 150c may be formed in a same manner and by any of the materials as discussed in connection with the insulating layers 150a, 150b. The top-electrode insulating layer 150c, together with the layers 150a, 150b form the compound insulating layer 150. The top electrode level insulating layer 150c hence refers to the sub-layer of the final compound insulating layer 150 which sub-layer embeds the top electrodes 351-353, 361-363.

A set of top contact holes 380 has been formed by etching the insulating layer 150. As shown, the top contact holes 380 expose top surfaces of selected top electrodes. A top contact hole mask layer (not shown) may be formed to cover insulating layer 150. The mask layer may include a stack of layers including for instance a SOC layer or other carbon-based layer and optionally further sub-layers such as Si-including antireflection layer. The mask layer may be patterned to include a hole pattern using a conventional litho-etch process. The hole pattern may be transferred into the insulating layer 150 to form the set of top contact holes 380. The etching of the holes 380 may include a final etch step using a different etching chemistry than the etching through the insulating layer 150 for opening the upper barrier layer 370. In FIG. 3L the hole 380 exposes the top electrode 363.

With reference to FIG. 3M, a set of gate contact holes 390 has been formed by etching the insulating layer 150, in particular the sub-layers 150c and 150b thereof. As shown, the gate contact holes 390 expose upper surfaces of gate portions of selected ones of the pattern parts 342, 344, 346, 348. To clarify the extension of the gate contact holes 390 a further sub-section is shown in FIG. 3M, which illustrates the structure along the cut indicated in the main view of FIG. 3M. The cut extends among others through the vertical semiconductor structure 133a of the third transistor 133. As shown, the hole 190 extends vertically down to the gate portion of the pattern part 346.

A gate contact hole mask layer (not shown) may be formed to cover insulating layer 150. The mask layer may include a stack of layers including for instance a SOC layer or other carbon-based layer and optionally further sub-layers such as Si-including antireflection layer. The mask layer may be patterned to include a hole pattern using a conventional litho-etch process. The hole pattern may be transferred into the insulating layer 150 to form the set of gate contact holes 390. During the etching of the insulating layer 150 the upper barrier layer 170 and the sidewall barrier layer 172 act as etch barriers and counteract the etching from exposing upper or sidewall surfaces of the top electrodes. The holes or openings in the gate contact hole mask layer may accordingly be formed to present a width dimension such that the etching through the holes exposes the sidewall barrier layer 372 of the top electrode 353 adjacent to the gate contact hole 390.

With reference to FIG. 3N, the set of gate contact holes 390 and the set of top contact holes 380 have been filled with a conductive material. A conductive material layer 392 covering the insulating layer 150 and filling the set of holes 380, 390 has been formed. The conductive material layer 392 may be formed by one metal material or by a combination, an alloy or a stack of sub-layers of one or more metal materials. The conductive material layer 392 may for instance be formed by or include Ti, TiN, WN, W, Al, Co, Ni or Ru.

With reference to FIG. 3O, a contact pattern has been transferred into the conductive material layer 392 to form a set of discrete contacts 394 of the device 1. The set of contacts 392 include gate contacts 398 connected to gates of the vertical semiconductor transistors and top contacts 396 connected to top electrodes on the vertical channel transistors.

The first bottom electrode region 110 and the first through third transistors 131-133 formed thereon (hidden from view in FIG. 3O) forms a first half-cell of a bit cell of the SRAM device. The second bottom electrode region 120 and the first through third transistors 141-143 formed thereon (hidden from view in FIG. 3O) forms a second half-cell of the bit cell. As shown in FIG. 3O, the device 1 may include a plurality of correspondingly configured bit cells.

It should be noted that the illustrated configurations of the top and gate contact hole patterns 380 and 390, as well as of the contact pattern 392 merely represents an illustrative example and that the configurations typically may vary depending on the underlying structure and the type of circuitry that is to be formed. Accordingly, further top and gate contact holes 380, 390 may be formed and further contacts 392 may be formed. The gate and top contacts may in turn be connected to lines of one or more routing layers formed above the bit cells during back-end-of-line processing. With respect to an SRAM, the routing layers may include one or more interconnection levels. The routing layers may include pull-up voltage lines (VSS) and pull-down voltage lines (VDD). The routing layers may include bit lines (BL) and complementary bit lines (BLB). The routing layers may include word lines (WL).

Figure 4:
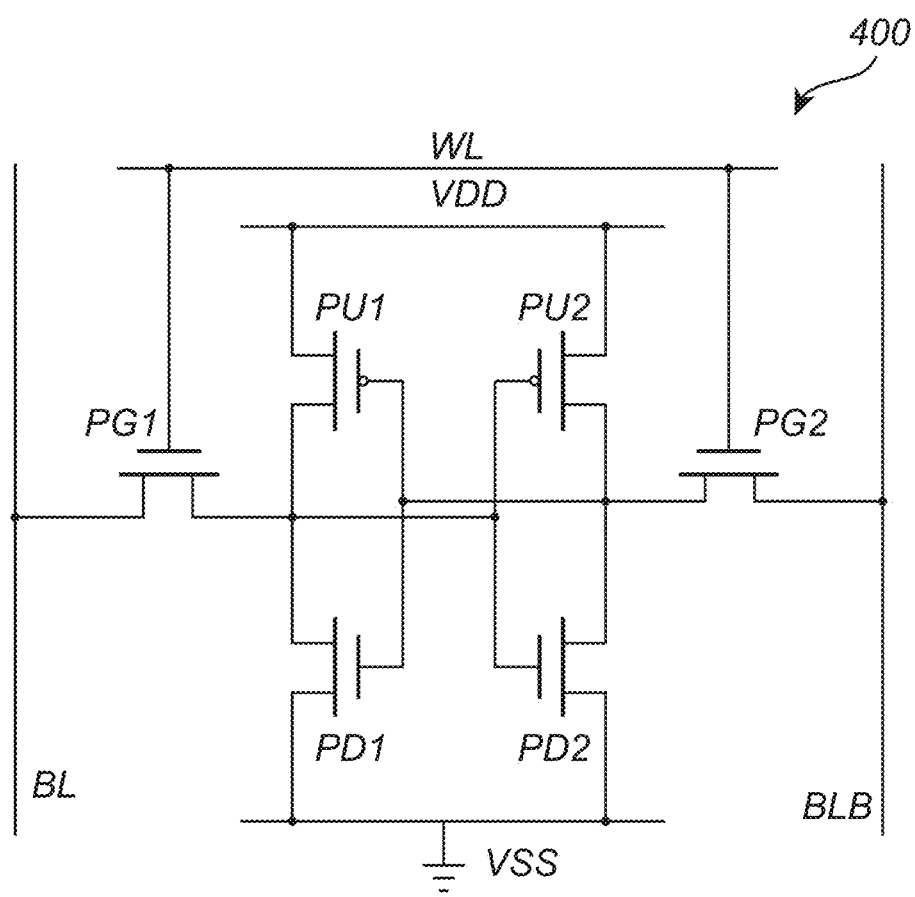
FIG. 4 illustrates a circuit layout of an SRAM bit cell comprising bottom electrode regions and vertical channel transistors, according to embodiments.

The first transistor 131 may form a pull-up transistor 131 of the first half-cell. The top electrode 351 formed on the pull-up transistor 131 may be connected to a pull-up voltage line VDD. The third transistor 143 may form a pull-up transistor 143 of the second half-cell. The top electrode 363 formed on the pull-up transistor 143 may be connected to a pull-up voltage line VDD. The second transistor 132 may form a pull-down transistor 132 of the first half-cell. The top electrode 352 formed on the pull-down transistor 132 may be connected to a pull-down voltage line VSS. The second transistor 142 may form a pull-down transistor 142 of the second half-cell. The top electrode 362 formed on the pull-down transistor 142 may be connected to a pull-down voltage line VSS. The third transistor 133 may form a pass transistor 133 of the first half-cell. The top electrode 353 formed on the pass transistor 133 may be connected to a bit line BL. The gate of the pass transistor 133 may be connected to a word line WL. The first transistor 141 may form a pass transistor 141 of the second half-cell. The top electrode 361 formed on the pass transistor 141 may be connected to a complementary bit line BLB. The gate of the pass transistor 141 may be connected to a word line WL. The connections to the respective lines VDD, VSS, BL, BLB and WL may be formed by forming vertical conductive vias in a manner which per se is known to the skilled person, for instance in a damascene style process. FIG. 4 illustrates a corresponding circuit layout of an SRAM bit cell 400. In FIG. 4, PU1 and PD1 denotes first pull-up and pull-down transistors, PU2 and PD2 denotes second pull-up and pull-down transistors, and PG1 and PG2 denotes first and second pass transistors PG1, PG2. As shown, the pull-up transistor PU1 and the pull-down transistor PD1 are connected to form a first inverter. The pull-up transistor PU2 and the pull-down transistor PD2 are connected to form a second inverter. The first and the second inverters are furthermore cross-coupled to each other and hence form a cross-coupled inverter pair.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A semiconductor device comprising:
    a semiconductor substrate;
    a semiconductor bottom electrode region comprising an implanted region implanted with a dopant of a first type and extending to a first vertical depth into the substrate;
    the implanted region having enclosed therein a first region, a second region and a third region each further implanted with a respective dopant and arranged laterally side-by-side, the second region being arranged between the first and the third regions;
    an insulating layer laterally extending to contact upper semiconductor surfaces of the first to third regions; and
    a first vertical channel transistor, a second vertical channel transistor and a third vertical channel transistor arranged on the first region, the second region and the third region, respectively,
    wherein the first, second and third regions are doped such that a first p-n junction is formed between the first region and the second region and a second p-n junction is formed between the second region and the third region,
    wherein each of the first, second and third regions is implanted with the respective dopant extending to a respective vertical depth shallower than the first vertical depth such that a connection region is formed in the bottom electrode region underneath the first, second and third regions, wherein the connection region and the first and third regions are doped with a dopant of a same type, and wherein the connection region is arranged such that a path extending between the first and third regions through the connection region forms a path of lowest resistance between the first region and the third region relative to paths extending between the first and third regions through the second region and the insulating layer.

2. The semiconductor device according to claim 1, wherein the semiconductor substrate is provided with a doped semiconductor layer, wherein the connection region is formed on the doped semiconductor layer, wherein the doped semiconductor layer is doped with a dopant of an opposite type to the dopant of the connection region.

3. The semiconductor device according to claim 1, wherein the connection region extends from a position underneath a channel of the first transistor to a position underneath a channel of the third transistor.

4. The semiconductor device according to claim 1, wherein the connection region is laterally coextensive with the first, second and third regions.

5. The semiconductor device according to claim 4, wherein the first region and the connection region coterminate at a first insulating layer, and wherein the third region and the connection region coterminate at a second insulating layer.

6. A static random access memory (SRAM) comprising a plurality of bit cells, each of the bit cells including a first half-cell and a second half-cell each including the semiconductor device according to claim 1,
    wherein the first, second and the third transistors included in the first half-cell form a first set of transistors including a pass transistor, a pull-up transistor and a pull-down transistor, and
    wherein the first, second and the third transistors included in the second half-cell form a second set of transistors including a pass transistor, a pull-up transistor and a pull-down transistor.

7. The SRAM according to claim 6, further comprising a conductive pattern including a first pattern part and a second pattern part arranged in each of the bit cells,
    wherein the first pattern part includes a first gate portion arranged in the first half-cell to form a common gate for the pull-up and pull-down transistors of the first set of transistors, a first bottom electrode contact portion contacting the first p-n junction of the second half-cell, and a first cross-coupling portion extending between the first bottom electrode contact portion and the first gate portion, and
    wherein the second pattern part includes a second gate portion arranged in the second half-cell to form a common gate for the pull-up and pull-down transistors of the second set of transistors, a second bottom electrode contact portion contacting the second p-n junction of the first half-cell, and a second cross-coupling portion extending between the second bottom electrode contact portion and the second gate portion.

8. The SRAM according to claim 7, further comprising a trench-filling insulating layer laterally embedding the bottom electrode regions of each of the bit cells and extending to a level below the connection regions of each of the bit cell, wherein the connection regions of the bottom electrode regions of the first and second half-cells are electrically insulated from each other.

9. The SRAM according to claim 7, further comprising:
a set of top electrodes arranged on top source/drains portions of the first and second sets of transistors of the bit cells, wherein an insulating sidewall barrier layer is formed on sidewalls of the top electrodes; and
a set of gate contacts, each gate contact including an upper contact portion arranged at a level above the top electrodes and a lower contact portion extending downwardly from the upper contact portion to a gate of a pass transistor of one of the bit cells, wherein the insulating sidewall barrier layers insulates the top electrodes from the lower contact portions of the gate contacts.

10. The semiconductor device according to claim 1, wherein the first region and the third region are doped at a higher dopant concentration level relative to the connection region.

11. The semiconductor device according to claim 1, wherein the semiconductor bottom electrode region extends lengthwise in a first lateral direction in which the first, second and third regions are laterally arranged side-by-side, wherein the semiconductor bottom electrode region has a substantially constant width in a second lateral direction perpendicular to the first lateral direction along each of the first, second and third regions, and wherein each of the first, second and third regions extend in the second lateral direction across an entire width of the semiconductor bottom electrode region.

* * * * *